US010976662B2

(12) United States Patent
Liu et al.

(10) Patent No.: US 10,976,662 B2
(45) Date of Patent: Apr. 13, 2021

(54) POSITIVE WORKING PHOTOSENSITIVE MATERIAL

(71) Applicant: AZ ELECTRONIC MATERIALS (LUXEMBOURG) S.À R.L., Luxembourg (LU)

(72) Inventors: Weihong Liu, Branchburg, NJ (US); PingHung Lu, Bridgewater, NJ (US); Chunwei Chen, Whitehouse Station, NJ (US); SookMee Lai, Petaling Jaya (MY); Yoshiharu Sakurai, Shizouka (JP); Aritaka Hishida, Shizouka (JP)

(73) Assignee: Merck Patent GmbH, Darmstadt (DE)

( * ) Notice: Subject to any disclaimer, the term of this patent is extended or adjusted under 35 U.S.C. 154(b) by 119 days.

(21) Appl. No.: 16/079,711

(22) PCT Filed: Apr. 18, 2017

(86) PCT No.: PCT/EP2017/059128
§ 371 (c)(1),
(2) Date: Aug. 24, 2018

(87) PCT Pub. No.: WO2017/182441
PCT Pub. Date: Oct. 26, 2017

(65) Prior Publication Data
US 2019/0064662 A1 Feb. 28, 2019

Related U.S. Application Data

(60) Provisional application No. 62/324,779, filed on Apr. 19, 2016.

(51) Int. Cl.
| G03F 7/004 | (2006.01) |
| G03F 7/039 | (2006.01) |
| C08K 5/378 | (2006.01) |
| C08L 53/00 | (2006.01) |
| C08L 61/06 | (2006.01) |
| G03F 7/023 | (2006.01) |

(52) U.S. Cl.
CPC ............ G03F 7/0392 (2013.01); C08K 5/378 (2013.01); C08L 53/005 (2013.01); C08L 61/06 (2013.01); G03F 7/0045 (2013.01); G03F 7/0048 (2013.01); G03F 7/0236 (2013.01); G03F 7/0397 (2013.01)

(58) Field of Classification Search
CPC .... G03F 7/0045; G03F 7/0392; G03F 7/0397; G03F 7/0048; G03F 7/0236; C07C 381/12; C08L 61/06; C08L 53/005; C08F 220/30; C08F 220/26; C08F 220/18; C08F 220/1802; C08F 220/1804; C08F 220/1807; C08F 220/281
See application file for complete search history.

(56) References Cited

U.S. PATENT DOCUMENTS

| 3,953,408 | A | 4/1976 | Hosoi et al. |
| 4,200,729 | A | 4/1980 | Calbo |
| 4,251,665 | A | 2/1981 | Calbo |
| 4,806,450 | A | 2/1989 | Hofmann et al. |
| 4,845,008 | A * | 7/1989 | Nishioka .............. G03F 7/0048 430/165 |
| 4,956,035 | A | 9/1990 | Sedlak |
| 5,187,019 | A | 2/1993 | Calbo et al. |
| 5,968,688 | A | 10/1999 | Masuda et al. |
| 6,210,846 | B1 | 4/2001 | Rangarajan et al. |
| 6,358,665 | B1 | 3/2002 | Pawlowski et al. |
| 6,824,947 | B2 | 11/2004 | Ishizuka et al. |
| 6,919,159 | B2 | 7/2005 | Matsumoto et al. |
| 6,991,888 | B2 | 1/2006 | Padmanaban et al. |
| 7,255,970 | B2 | 8/2007 | Toukhy et al. |
| 7,358,408 | B2 | 4/2008 | Rahman et al. |
| 7,601,482 | B2 | 10/2009 | Pawlowski et al. |
| 8,841,062 | B2 * | 9/2014 | Liu ........................ G03F 7/0392 430/270.1 |
| 8,906,594 | B2 | 12/2014 | Chen et al. |
| 9,012,126 | B2 | 4/2015 | Liu et al. |
| 9,244,354 | B2 | 1/2016 | Washio et al. |
| 9,633,848 | B2 | 4/2017 | Aoki et al. |
| 2001/0044075 | A1 | 11/2001 | Nishimura et al. |
| 2002/0058199 | A1 | 5/2002 | Zampini et al. |
| 2002/0061464 | A1 | 5/2002 | Aoal et al. |
| 2004/0005513 | A1 | 1/2004 | Takahashi et al. |
| 2004/0009429 | A1 * | 1/2004 | Sato ........................ G03F 7/0045 430/287.1 |
| 2004/0110099 | A1 | 6/2004 | Kozawa et al. |
| 2004/0142280 | A1 | 7/2004 | Iwamaga et al. |

(Continued)

FOREIGN PATENT DOCUMENTS

| EP | 0935171 A1 | 8/1999 |
| GB | 2415514 A | 12/2005 |

(Continued)

OTHER PUBLICATIONS

Machine translation of JP 2013-127517 (no date).*
International Search Report, PCT/EP2017/059128, dated Aug. 17, 2017, corresponds to U.S. Appl. No. 16/079,711.
International Search Report, PCT/EP2013/059771, dated Jul. 29, 2013, corresponds to U.S. Appl. No. 13/524,790.
International Search Report, PCT/EP2013/059772, dated Jul. 25, 2013 corresponds to U.S. Appl. No. 13/524,811.
Machine English translation of JP5778568B2, Sep. 16, 2015.
Machine English Abstract translation of JP8-78317, Mar. 22, 1996.
Machine English Abstract translation of JP2009-63824A, Mar. 26, 2009.

*Primary Examiner* — Amanda C. Walke
(74) *Attorney, Agent, or Firm* — Francis M. Houlihan

(57) ABSTRACT

The present application for patent relates to a light-sensitive positive working photosensitive composition especially useful for imaging thick films using a composition which gives very good film uniformity and promotes a good process latitude against feature pattern collapse in patterns created upon imaging and developing of these films.

38 Claims, No Drawings

(56) References Cited

U.S. PATENT DOCUMENTS

| | | |
|---|---|---|
| 2004/0265733 A1 | 12/2004 | Houlihan et al. |
| 2005/0019691 A1 | 1/2005 | Tseng et al. |
| 2005/0019705 A1 | 1/2005 | Thackeray et al. |
| 2005/0136341 A1 | 6/2005 | Park et al. |
| 2005/0271974 A1 | 12/2005 | Rahman et al. |
| 2007/0015080 A1* | 1/2007 | Toukhy ............... G03F 7/0392 430/270.1 |
| 2007/0077519 A1* | 4/2007 | Tarutani ............ G03F 7/0397 430/270.1 |
| 2007/0087288 A1 | 4/2007 | Fumiyuki et al. |
| 2007/0190465 A1 | 8/2007 | Nishikawa et al. |
| 2007/0275320 A1 | 11/2007 | Washio et al. |
| 2008/0076044 A1 | 3/2008 | Mizukawa et al. |
| 2008/0090172 A1 | 4/2008 | Hatakeyama et al. |
| 2009/0176337 A1 | 7/2009 | Kang et al. |
| 2010/0047715 A1 | 2/2010 | Washio et al. |
| 2010/0248146 A1 | 9/2010 | Tsuchihashi et al. |
| 2011/0081612 A1 | 4/2011 | Fujii et al. |
| 2011/0135749 A1 | 6/2011 | Sellinger et al. |
| 2011/0214994 A1 | 9/2011 | Utsumi et al. |
| 2012/0003437 A1 | 1/2012 | Wada et al. |
| 2012/0004341 A1 | 1/2012 | Kim et al. |
| 2012/0141940 A1 | 6/2012 | Shimizu et al. |
| 2014/0183162 A1* | 7/2014 | Cho ...................... G03F 7/092 216/49 |
| 2017/0210836 A1* | 7/2017 | Domon ................ C08F 212/24 |
| 2017/0242339 A1* | 8/2017 | Hatakeyama ........... G03F 7/162 |
| 2017/0277037 A1* | 9/2017 | Hatakeyama ......... G03F 7/2041 |
| 2017/0363961 A9* | 12/2017 | Namai ................. C08F 220/30 |
| 2019/0187558 A1* | 6/2019 | Nihashi ............... G03F 7/0397 |

FOREIGN PATENT DOCUMENTS

| | | | |
|---|---|---|---|
| JP | 8-78317 A | | 3/1996 |
| JP | 2009-63824 A | | 3/2009 |
| JP | 2010175828 A | * | 8/2010 |
| JP | 2013127517 A | * | 6/2013 |
| JP | 5778568 B2 | | 9/2015 |
| TW | 200619838 A | | 6/2006 |
| TW | 200712763 A | | 4/2007 |
| TW | 201530253 A | | 8/2015 |
| WO | 2005-054951 A2 | | 6/2005 |
| WO | 2007-022124 A2 | | 2/2007 |
| WO | 2007-110773 A2 | | 10/2007 |
| WO | 2011-046192 A1 | | 4/2011 |
| WO | 2014-069202 A1 | | 5/2014 |

\* cited by examiner

POSITIVE WORKING PHOTOSENSITIVE MATERIAL

FIELD OF THE INVENTION

The present application for patent relates to a light-sensitive positive photoresist composition especially useful for imaging thick films using a composition which gives very good film uniformity and promotes a good process latitude against feature pattern collapse in patterns created upon imaging and developing of these films.

BACKGROUND

Photoresist compositions are used in microlithography processes for making miniaturized electronic components such as in the fabrication of integrated circuit devices. Generally, in these processes, a coated film of a photoresist composition is applied to a substrate such as silicon wafers used for making integrated circuits, circuit boards and flat panel display substrates. The coated substrate is then baked to evaporate any solvent in the photoresist composition and to fix the coating onto the substrate. The baked coated surface of the substrate is next subjected to an image-wise exposure to actinic radiation.

This actinic radiation exposure causes a chemical transformation in the exposed areas of the coated surface. Visible light, ultraviolet (UV) light, extreme ultraviolet (EUV), electron beam and X-ray radiant energy are radiation types commonly used today in microlithographic processes. After this image-wise exposure, the coated substrate is treated with a developer solution to dissolve and remove either the radiation-exposed areas (for positive-type photoresists) or the unexposed areas (for negative-type photoresists) of the coated surface of the substrate.

After this development operation, the now partially unprotected substrate may be treated with a substrate-etchant solution, plasma gases or reactive ions, or have metal or metal composites deposited in the spaces of the substrate where the photoresist coating was removed during development. The areas of the substrate where the photoresist coating still remains are protected. Later, the remaining areas of the photoresist coating may be removed during a stripping operation, leaving a patterned substrate surface. In some instances, it is desirable to heat treat the remaining photoresist layer, after the development step and before the etching step, to increase its adhesion to the underlying substrate.

In the manufacture of patterned structures, such as wafer level packaging, displays, light emitting diode applications or microelectromechanical systems, electrochemical deposition of electrical interconnects has been used as the interconnect density increases. For example, see Solomon, Electrochemically Deposited Solder Bumps for Wafer-Level Packaging, Packaging/Assembly, Solid State Technology, pages 84-88, April 2001. Gold bumps, copper or other metal posts and copper traces for redistribution in wafer level packaging require a photoresist mold that can later be electroplated to form the final metal structures in advanced interconnect technologies. The photoresist layers are very thick compared to the photoresists used in the IC manufacturing of critical layers. Both feature size and photoresist thickness are typically in the range of 2 µm to 100 µm, (micrometers) so that high aspect ratios (photoresist thickness to line size) have to be patterned in the photoresist.

Positive-acting photoresists comprising novolak polymers and quinone-diazide compounds as photoactive compounds dissolved in conventional spin casting solvent such PGMEA or PGME are well known in the art. Novolak polymers may also be reacted with quinone diazides and combined with a polymer. It has been found that photoresists based on only novolak/diazide do not have the photosensitivity or the steepness of sidewalls necessary for certain type of processes, especially for very thick films. Moreover a high dark-film loss in the developer is often observed and such coating may have poor coating uniformity.

Known chemically amplified photoresists, such as those based on blocked poly-4-hydroxystyrene (PHOST), blocked copolymers comprising hydroxystyrene and a blocked (meth)acrylic acid repeat unit such as tert-butyl (meth)acrylate, or (meth)acrylic materials comprising alicyclic groups, acid cleavable groups, and dissolution modifying groups such as anhydrides or lactones dissolved in conventional spin casting solvent such PGMEA or PGME as may exhibit the required photosensitivity and thickness requirement, but may also exhibit adhesion failure, during subsequent unit operations such as plating or etching. Moreover, these materials may also exhibit poor coating uniformity and also have poor process latitude against pattern collapse during unit. Such failures may lead to feature sidewalls that are rough, undercut or have protrusions somewhere in the metal feature and produce features with high defect counts because of the lack of process latitude against pattern collapse and poor coating uniformity. Moreover, these photoresists may be prohibitively expensive.

Chemically amplified resist comprising mixtures of novolak polymers with polymers based on blocked poly-4-hydroxystyrene (PHOST), blocked copolymers comprising hydroxystyrene and a blocked (meth)acrylic acid repeat unit such as tert-butyl (meth)acrylate, or (meth)acrylic materials comprising alicyclic groups, acid cleavable groups, and dissolution modifying groups such as anhydrides or lactones dissolved in conventional spin casting solvent such PGMEA or PGME as may exhibit the required photosensitivity and thickness requirement, but may also exhibit adhesion failure, during subsequent unit operations such as plating or etching. Moreover, these materials may also exhibit poor coating uniformity and also have poor process latitude against pattern collapse during unit. Such failures may lead to feature sidewalls that are rough, undercut or have protrusions somewhere in the metal feature and produce features with high defect counts because of the lack of process latitude against pattern collapse and poor coating uniformity.

Therefore, there remains a need for a positive photoresist material that give good thick film coating uniformity, exhibits high photosensitivity with good process latitude against pattern collapse, even in thick film applications, requires process worthy development times, exhibits low dark film loss in developers and basic plating solutions, and withstands wet plating and etching operations to produce features that have smooth side walls. The present disclosure and the accompanying claims address these needs.

These novel compositions are also suited for imaging on reflective and chalcophilic substrates that produces low defect, images at high resolution.

BRIEF DESCRIPTION

Disclosed herein is a positive working photosensitive composition comprising:
a) at least one photoacid generator;
b) at least one novolak polymer;

c) at least one polymer comprising one or more (meth) acrylate repeat units and further comprising one or more repeat units with at least one acid cleavable group; and
d) a solvent mixture selected from the group consisting of:
  d1) a solvent mixture consisting essentially of a composition of PGMEA and 3MBA which ranges from 95 wt % Propylene Glycol Methyl Ether Acetate (PGMEA) and 5 wt % 3-Methoxybutyl Acetate (3MBA) to 61 wt % PGMEA and 39 wt % 3MBA;
  d2) a solvent mixture consisting essentially of a composition of PGMEA and GBL which ranges from 95 wt % PGMEA and 5 wt % gamma-butyrolactone (GBL) to 20 wt % PGMEA and 80 wt % GBL; and
  d3) a solvent mixture consisting essentially of a composition of PGMEA and PGDA which ranges from 95 wt % PGMEA and 5 wt % Propylene Glycol Diacetate (PGDA) to 20 wt % PGMEA and 80 wt % PGDA. The invention also pertains to a method of forming a positive relief image comprising:
  a) forming a photosensitive layer by applying the inventive positive working photosensitive composition to a substrate;
  b) image-wise exposing the photosensitive layer to actinic radiation to form a latent image; and
  c) developing the latent image in a developer, and optionally wherein the image-wise exposed photosensitive layer is thermally treated.

DETAILED DESCRIPTION

As used herein, the conjunction "or" is not intended to be exclusive unless otherwise indicated or required by the context. For example, the phrase "or, alternatively" is intended to be exclusive. As a further example, "or" may be exclusive when describing chemical substitution at a specific site.

As used herein, the term "chalcophile" is an element that has an affinity for the chalcogen elements, sulfur, selenium and tellurium. Other than the chalcogens themselves, these elements may include copper, zinc, gallium, germanium, arsenic, silver, cadmium, lanthanum, tin, antimony, gold, mercury, thallium, lead, and bismuth. Without limitation, these elements may form bonds with one or more of the chalcogen elements that are primarily covalent in character. A chalcophile substrate comprises one or more of the above listed chalcophiles.

As used herein, the term "monomer repeat unit" refers to a polymer repeat unit derived from a monomer.

As used herein, it is understood that a repeat unit within a polymer may be referred to by its corresponding monomer. For example, acrylate monomer (1) corresponds to its polymer repeat unit (2).

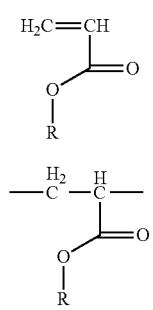

As used herein, the designation "(meth)acrylate repeat unit" may refer to an acrylate repeat unit or, alternatively, a methacrylate repeat unit. Accordingly, "acrylic acid" and "methacrylic acid" are collectively referred to as "(meth) acrylic acid", an "acrylic acid derivative" and a "methacrylic acid derivative" are collectively referred to as a "(meth) acrylic acid derivative", and "acrylate" and "methacrylate" are collectively referred to as "(meth)acrylate".

As used herein the term "acid cleavable group" embodies protecting group cleavable by a catalytic amount of acid a process of acidolysis or through the hydroxysis of a ketal or acetal protective moiety. The acidolysis process proceeds upon the catalytic action of a proton on a suitable protecting group cleaveable by acididolysis intermediacy of a tertiary carbocation, or a stabilized secondary carbocation (e.g. secondary benzylic, allylic and the like) where the any intermediate carbocation formed by cleavable of the acid cleavable group has available at least one hydrogen attached to a carbon directly attached to the carbocation carbon. In this manner, any such carbocation formed can participate in an elimination reaction forming an olefin and also regenerating at the same time the proton acid catalyst moiety ($H^+$) which initially formed the carbocation. Protective groups cleaving through a hydrolysis process may also be employed but only if these cleave through the intermediacy of a stable cation which can react with advantageous water to regenerate effectively the acid catalyst. Such protecting groups are ketals, acetals and silyl protecting groups. Moieties which release primary, non-activated secondary carbocation or a tertiary carbocation which does not have an available beta-hydrogen are not effective acid cleavable protecting groups for these inventive positive working photosensitive composition because they have poor capability to regenerate the acid catalyst and consequently have poor acid cleaving efficiency and will not effectively result in chemical amplification, resulting in resist composition poor or no lithographic sensitivity.

Disclosed herein is a positive working photosensitive composition comprising:
  a) at least one photoacid generator;
  b) at least one novolak polymer;
  c) at least one polymer comprising one or more (meth) acrylate repeat units and further comprising one or more repeat units with at least one acid cleavable group; and
  d) a solvent mixture selected from the group consisting of:
    d1) a solvent mixture consisting essentially of a composition of PGMEA and 3MBA which ranges from 95 wt % Propylene Glycol Methyl Ether Acetate (PGMEA) and 5 wt % 3-Methoxybutyl Acetate (3MBA) to 61 wt % PGMEA and 39 wt % 3MBA;
    d2) a solvent mixture consisting essentially of a composition of PGMEA and GBL which ranges from 95 wt % PGMEA and 5 wt % gamma-butyrolactone (GBL) to 20 wt % PGMEA and 80 wt % GBL; and
    d3) a solvent mixture consisting essentially of a composition of PGMEA and PGDA which ranges from 95 wt % PGMEA and 5 wt % Propylene Glycol Diacetate (PGDA) to 20 wt % PGMEA and 80 wt % PGDA.

In another embodiment of this novel positive working photosensitive composition, in item d) the solvent is the solvent mixtures d1, d2 and d3 are further selected as follows:
    d1) solvent mixture consisting essentially of a composition of PGMEA and 3MBA which ranges from 95 wt % Propylene Glycol Methyl Ether Acetate (PGMEA) and 5 wt % 3-Methoxybutyl Acetate (3MBA) to 61 wt % PGMEA and 33 wt % 3MBA;

d2) a solvent mixture consisting essentially of a composition of PGMEA and GBL which ranges from 95 wt % PGMEA and 5 wt % gamma-butyrolactone (GBL) to 20 wt % PGMEA and 40 wt % GBL; and d3) a solvent mixture consisting essentially of a composition of PGMEA and PGDA which ranges from 95 wt % PGMEA and 5 wt % Propylene Glycol Diacetate (PGDA) to 20 wt % PGMEA and 80 wt % PGDA.

In another embodiment of this novel positive working photosensitive composition, the positive working photosensitive the solvent mixture is d1.

In another embodiment of this novel positive working photosensitive composition, the positive working photosensitive the solvent mixture is d2.

In another embodiment of this novel positive working photosensitive composition, the positive working photosensitive the solvent mixture is d3.

The positive working photosensitive composition disclosed herein may include a variety of photoacid generators, such as onium salts, dicarboximidyl sulfonate esters, oxime sulfonate esters, diazo(sulfonyl methyl) compounds, disulfonyl methylene hydrazine compounds, nitrobenzyl sulfonate esters, biimidazole compounds, diazomethane derivatives, glyoxime derivatives, β-ketosulfone derivatives, disulfone derivatives, sulfonic acid ester derivatives, imidoyl sulfonate derivatives, halogenated triazine compounds, diazonaphthoquinone sulfonate esters or combinations thereof.

In another aspect of the positive working photosensitive composition disclosed herein the photoacid generator may comprise, without limitation, alkyl sulfonate anions, substituted and unsubstituted aryl sulfonate anions, fluoroalkyl sulfonate anions, fluoarylalkyl sulfonate anions, fluorinated arylalkyl sulfonate anions, hexafluorophosphate anions, hexafluoroarsenate anions, hexafluoroantimonate anions, tetrafluoroborate anions, equivalents thereof or combinations thereof.

Specifically, without limitation, suitable photoacid generators may include triphenylsulfonium trifluoromethanesulfonate, triphenylsulfonium nonafluoro-n-butanesulfonate, triphenylsulfonium perfluoro-n-octanesulfonate, and triphenylsulfonium 2-(bicyclo[2.2.1]heptan-2-yl)-1,1,2,2-tetrafluoroethanesulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-(bicyclo[2.2.1]heptan-2-yl)-1,1,2,2-tetrafluoroethanesulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, and 4-methanesulfonylphenyldiphenylsulfonium 2-(bicyclo[2.2.1]heptan-2-yl)-1,1,2,2-tetrafluoroethanesulfonate, diphenyliodonium trifluoromethanesulfonate, diphenyliodonium nonafluoro-n-butanesulfonate, diphenyliodonium perfluoro-n-octanesulfonate, diphenyliodonium 2-(bicyclo[2.2.1]heptan-2-yl)-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-(bicyclo[2.2.1]heptan-2-yl)-1,1,2,2-tetrafluoroethanesulfonate, 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-(bicyclo[2.2.1]heptan-2-yl)-1,1,2,2-tetrafluoroethanesulfonate, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-(bicyclo[2.2.1]heptan-2-yl)-1,1,2,2-tetrafluoroethanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-(bicyclo[2.2.1]heptan-2-yl)-1,1,2,2-tetrafluoroethanesulfonate N-(trifluoromethanesulfonyloxy)bicyclo[2.2.1]hept-5-ene-2,3-dicarboximide, N-(nonafluoro-n-butanesulfonyloxy)bicyclo[2.2.1]hept-5-ene-2,3-dicarboximide, N-(perfluoro-n-octanesulfonyloxy)bicyclo[2.2.1]hept-5-ene-2,3-dicarboximide, N-[2-(bicyclo[2.2.1]heptan-2-yl)-1,1,2,2-tetrafluoroethanesulfonyloxy]bicyclo[2.2.1]hept-5-ene-2,3-dicarboximide, 1,3-dioxo-1H-benzo[de]isoquinolin-2(3H)-yl trifluoromethanesulfonate(naphthalene dicarboximidyl triflate), N-[2-(tetracyclo[4.4.0.1$^{2,5}$.1$^{7,10}$]dodec-3-yl)-1,1-difluoroethanesulfonyloxy]bicyclo[2.2.1]hept-5-ene-2,3-dicarboximide, 1,3-dioxoisoindolin-2-yl trifluoromethanesulfonate, 1,3-dioxoisoindolin-2-yl nonafluoro-n-butane sulfonate, 1,3-dioxoisoindolin-2-yl perfluoro-n-octane sulfonate, 3-dioxoisoindolin-2-yl 2-(bicyclo[2.2.1]heptan-2-yl)-1,1,2,2-tetrafluoroethanesulfonate, 3-dioxoisoindolin-2-yl N-[2-(tetracyclo[4.4.0.1$^{2,5}$.1$^{7,10}$]dodecan-3-yl)-1,1-difluoroethanesulfonate, 1,3-dioxo-1H-benzo[de]isoquinolin-2(3H)-yl trifluoromethanesulfonate, 1,3-dioxo-1H-benzo[de]isoquinolin-2(3H)-yl nonafluoro-n-butane sulfonate, 1,3-dioxo-1H-benzo[de]isoquinolin-2(3H)-yl perfluoro-n-octanesulfonate, 1,3-dioxo-1H-benzo[de]isoquinolin-2(3H)-yl 2-(bicyclo[2.2.1]heptan-2-yl)-1,1,2,2-tetrafluoroethanesulfonate, or 1,3-dioxo-1H-benzo[de]isoquinolin-2(3H)-yl N-[2-(tetracyclo[4.4.0.1$^{2,5}$.1$^{7,10}$]dodecan-3-yl)-1,1-difluoroethanesulfonate, (E)-2-(4-methoxystyryl)-4,6-bis(trichloromethyl)-1,3,5-triazine, 2-(Methoxyphenyl)-4,6-bis-(trichloromethyl)-s-triazine, 2-[2-(Furan-2-yl)ethenyl]-4,6-bis(trichloromethyl)-s-triazine, 2-[2-(5-methylfuran-2-)ethenyl)-4,6-bis(trichloromethyl)-s-triazine, 2-[2-(3,4-Dimethoxyphenypethenyl]-4,6-bis(trichloromethyl)-s-triazine, equivalents thereof or combinations thereof. Suitable photoacid generators may also include onium salts comprising anions and cations in combinations not shown supra.

The positive working photosensitive composition disclosed herein may also comprise photosensitizers that extend the effective wavelength and/or energy range. Such photosensitizers may be, without limitation, substituted and unsubstituted anthracenes, substituted and unsubstituted phenothiazines, substituted and unsubstituted perylenes, substituted and unsubstituted pyrenes, and aromatic carbonyl compounds, such as benzophenone and thioxanthone, fluorene, carbazole, indole, benzocarbazole, acridone chlorpromazine, equivalents thereof or combinations of any of the foregoing. Novolak polymers used in the novel composition comprise repeat units having bridges and phenolic compounds. Suitable phenolc compounds include, without limitation, phenols, cresols, substituted and unsubstituted resorcinols, xylenols, substituted and unsubstituted benzene triols, substituted and unsubstituted naphthalenes and combinations thereof. In a more specific example the above described photosensitizers that extend the effective wavelength and/or energy range selected from substituted and unsubstituted naphthalenes and combinations thereof. In a even more specific examples the photosensitizer is 1,5-dihydroxynaphthalene.

In the positive working photosensitive composition disclosed herein the Novolak polymers may be produced, usually, with an acid catalyst, by condensation polymerization of phenolic compounds and aldehydes such as formaldehyde, acetaldehyde or substituted or unsubstituted benzaldehydes or condensation products of phenolic compounds and substituted or unsubstituted methylol compounds. Bridges described supra may comprise methylene groups or methyne groups. Novolak polymers can also be made as condensation products of ketones such as acetone, methyl ethyl ketone, acetophenone and the like. Catalysts may include Lewis acids, Brønstead acids, dicationic and tricationic metal ions and the like. For example, without limitation, aluminum chloride, calcium chloride, manganese chloride, oxalic acid, hydrochloric acid, sulfuric acid, methane sulfonic acid trifluoromethane sulfonic acid or combinations comprising any of the foregoing may be used.

In the positive working photosensitive composition disclosed herein, examples of suitable novolak polymers include those obtained by the condensation reaction between a phenolic compound such as phenol, o-cresol, m-cresol, p-cresol, 2-5-xylenol and the like with an aldehyde compound such as formaldehyde in the presence of an acid or multivalent metal-ion catalyst. An exemplary weight average molecular weight for the alkali-soluble novolak polymer may be in the range from 1,000 to 30,000 Daltons. A further exemplary weight average molecular weight may be from 1,000 to 20,000 Daltons. A still further exemplary weight average molecular weight may be from 1,500 to 10,000 Daltons. Exemplary bulk dissolution rates for novolak polymers in 2.38% aqueous tetramethylammonium hydroxide are 10 Å/sec (Angstrom units per second) to 15,000 Å/sec. Further exemplary bulk dissolution rates are 100 Å/sec to 10,000 Å/sec. Still further exemplary bulk dissolution rates are 200 Å/sec to 5,000 Å/sec. A still further exemplary bulk dissolution rate of 1,000 Å/sec may be obtained from a single novolak polymer or a blend of novolak polymers, each comprising m-cresol repeat units.

In another aspect of the positive working photosensitive composition disclosed herein, exemplary cresylic novolak polymers may comprise, in cresol mole percentage terms, 0%-60% p-cresol, 0%-20% o-cresol, and 0%-80% m-cresol. Further exemplary cresylic novolak polymers may comprise 0%-50% p-cresol, 0%-20% o-cresol, and 50%-100% m-cresol. Repeat units in novolak polymers are defined by the composition of the polymer, so that, for example, p-cresol may be introduced by polymerization with an aldehyde or by dimethylol-p-cresol. Moreover, cresylic novolak polymers may contain other phenolic compounds such as phenol, xylenols, resorcinols, benzene triols and the like. Further, novolak polymers can be branched or linear and may be blended to achieve a selected repeat unit mole percentage or dissolution rate. Bulk dissolution rates may be measured by the following procedure: (1) A 1-3 µm (micrometer) film of the novolak resin is spin-coated from a solution on a silicon wafer and soft baked at 110° C. for 120 seconds on a contact hot plate. (2) The film thickness is measured using an optical method such as interferometry or elipsometry or a mechanical profilometer. (3) The coated wafer is immersed in a solution of tetramethylammonium hydroxide (TMAH) developer and the time to dissolve completely the novolak film ($t_c$) is detected visually or by means of optical inteferometry (for example, a dissolution rate monitor). The bulk dissolution rate is calculated dividing the film thickness by $t_c$.

In another aspect of the positive working photosensitive composition disclosed herein, the positive working photosensitive composition is one wherein the at least one novolak polymer comprises one or more cresylic repeat units selected from the group consisting of o-cresol, p-cresol and m-cresol.

In another aspect of the positive working photosensitive composition disclosed herein, the positive working photosensitive composition is one wherein the at least one novolak polymer is a cresylic novolak comprising at least 80 mole percent m-cresol.

In accordance with the present disclosure, the novel positive working photosensitive composition comprises one or more polymers comprising one or more (meth)acrylate repeat units and further comprising one or more repeat units with at least one acid cleavable group; these polymers may further comprise one or more repeat units. In particular, polymers may comprise repeat units chosen from styrenic repeat units, (meth)acrylate repeat units or combinations thereof.

The positive working photosensitive composition may further comprise a combination of 2 or more polymers, such as a novolak polymer and an acrylate and/or styrenic copolymer. Such additional polymer components are disclosed in U.S. Pat. No. 9,012,126 filed Jun. 15, 2012, issued Apr. 21, 2015, and incorporated herein in its entirety.

More particularly, styrenic repeat units may have the structure

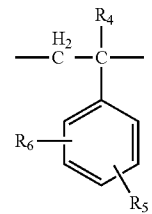

where $R_4$ is chosen from H, Cl or $CH_3$ and $R_5$ and $R_6$ can be the same or different, and are chosen from H, OH, $OCOOR_7$, or $OCOCOOR_7$ and $R_7$ is an acid cleavable group. The polymer of the present invention may comprise (meth) acrylate units only or a mixture of (meth)acrylate and styrenic units. Acid labile groups may be present in the polymer. The polymer may comprise acid cleavable groups which may be esterified to a (meth)acrylate repeat unit via the carboxylate group or to a carbonate or oxylate group; which carbonate or oxylate group is, in turn, esterified to a phenol or an alcohol. For example, a monomer repeat unit, known in the art, is tert-butyl 4-vinylphenyl carbonate, in which a tert-butyl carbonate is esterified to 4-hydroxystyrene. Acid cleavable groups may include, without limitation, a t-butyl group, a tetrahydropyran-2-yl group, a tetrahydrofuran-2-yl group, a 4-methoxytetrahydropyran-4-yl group, a 1-ethoxyethyl group, a 1-butoxyethyl group, a 1-propoxyethyl group, a 3-oxocyclohexyl group, a 2-methyl-2-adamantyl group, a 2-ethyl-2-adamantyl group, a 8-methyl-8-tricyclo[5.2.1.0 2,6]decyl group, a 1,2,7,7-tetramethyl-2-norbornyl group, a 2-acetoxymenthyl group, a 2-hydroxymethyl group a 1-methyl-1-cyclohexylethyl group, a 4-methyl-2-oxotetrahydro-2H-pyran-4-yl group, a 2,3-dimethylbutan-2-yl group, a 2,3,3-trimethylbutan-2-yl group, a 1-methyl cyclopentyl group, a 1-ethyl cyclopentyl group, a 1-methyl cyclohexyl group, 1-ethyl cyclohexyl group, a 1,2,3,3-tetramethylbicyclo[2.2.1]heptan-2-yl group, a 2-ethyl-1,3,3-trimethylbicyclo[2.2.1]heptan-2-yl group, a 2,6,6-trimethylbicyclo[3.1.1]heptan-2-yl group, a 2,3-dimethylpentan-3-yl group, or a 3-ethyl-2-methylpentan-3-yl group. A monomer repeat unit with an acid cleavable group is said to be protected. Polymers may be fully protected, partially protected, partially deprotected or fully deprotected. Deprotection may occur, for example, during or after exposure of the positive working photosensitive composition when photogenerated acid is present.

In accordance with the present disclosure, the novel positive working photosensitive composition comprises one or more polymers comprising one or more (meth)acrylate repeat units and further comprising one or more repeat units with at least one acid cleavable group; in addition to monomer repeat units having acid cleavable groups, these polymers may further comprise monomer repeat units that impart etching resistance, modify the dissolution characteristics of the polymer in its protected, partially protected, partially deprotected or fully deprotected forms, modify photosensitivity, modify adhesion, provide a bound photoacid generator or impart other useful characteristics. Monomer repeat units may include, without limitation, certain chemical functionalities such as lactones, anhydrides, alcohols, carboxylic acids, substituted and unsubstituted benzyl groups, ethers, alicyclic esters, ester alcohols, ester ethers, aliphatic esters, aromatic esters and the like.

Monomers from which monomer repeat unit are derived may include, without limitation, (meth)acrylic acid, 2-methoxyethyl (meth)acrylate, 2-ethoxyethyl (meth)acrylate, benzyl (meth)acrylate, 2-hydroxypropyl (meth)acrylate, 4-hydroxybenzyl (meth)acrylate, 2-isobornyl methacrylate, 3-isobornyl (meth)acrylate, 1-adamantyl (meth) acrylate, styrene, 4-hydroxystyrene, tert-butyl 4-vinylphenyl carbonate, mevolonic lactone methacrylate, 2-oxotetrahydrofuran-3-yl (meth)acrylate, 2-oxotetrahydro-2H-pyran-3-yl (meth)acrylate, or 2-oxooxepan-3-yl (meth)acrylate.

In accordance with the present disclosure, the novel positive working photosensitive composition comprises one or more polymers comprising one or more (meth)acrylate repeat units and further comprising one or more repeat units with at least one acid cleavable group; the acrylate polymer may comprise (3):

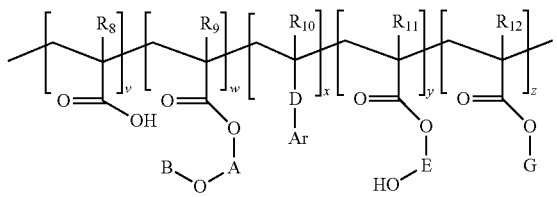

(3)

wherein $R_8$-$R_{12}$ are, independently, —H, F or —CH$_3$, A is a linear or branched $C_1$-$C_{10}$ alkylene group, B is a $C_1$-$C_{12}$ alkyl or alicyclic group, D is a linking group that may be a chemical bond, a carboxylate group, wherein the carbonyl carbon is bonded to the polymer backbone, or a —COOCH$_2$— group, wherein the carbonyl carbon is bonded to the polymer backbone, Ar is a substituted or unsubstituted aromatic group or heteroaromatic group, E is a linear or branched $C_2$-$C_{10}$ alkylene group, G is an acid cleavable group, v is 0-10 mole %, w is 0 mole %-20 mole %, x is 14 mole %-80 mole %, y is 0 mole %-40 mole % and z is 20 mole %-50 mole % provided that v+w+x+y+z=100%. Substituted Ar may be inclusive of an aromatic group substituted with hydroxyl group. Ar may be phenyl or hydroxyphenyl. The general formula above is not meant to show the exact positioning of the component parts of the polymer so that the parts may exist together randomly, as well, 2 or more of the same component part may exist side-by-side in the polymer.

In accordance with the above embodiments, (3) may be synthesized using one or more feeds of the indicated monomers. At least some of the monomers may be introduced at the beginning of the polymerization reaction in whole or in part. Further, monomer feeds may be accomplished at selected feed rates during the reaction to accommodate different monomer co-reactivities or to control other polymer properties such as molecular weight or solubility. Polymerization may be initiated by free radical initiators, cationic polymerization initiators, anionic polymerization initiators or chelating catalysts.

Polymers having the general composition (3) may comprise (meth)acrylic repeat units as well as substituted or unsubstituted styrene units. Accordingly, $R_8$-$R_{12}$ may, independently, be either —H or —CH$_3$.

In (3), supra, exemplary groups for A may be, without limitation, methylene, methylmethylene, ethylene, 1,2-propylene, 2,1-propylene or the like. Exemplary groups for B may be, without limitation, methyl, ethyl, propyl, isopropyl, butyl, isobutyl or the like. Exemplary groups for E may be, without limitation, methylene, methylmethylene, ethylene, 1,2-propylene, 2,1-propylene or the like. Exemplary groups for D may be, —COOCH$_2$—, wherein the carbonyl carbon is bonded to the polymer backbone, a chemical bond or a —COO— group, wherein the carbonyl carbon is bonded to the polymer backbone. Exemplary groups for —Ar may be, without limitation, phenyl, 2-, 3-, or 4-methylphenyl, 2-, 3-, or 4-hydroxyphenyl, 1-, 2-, or 3-naphthyl, or the like. In (I), supra, exemplary acid cleavable groups for G may be, without limitation, a t-butyl group, a tetrahydropyran-2-yl group, a tetrahydrofuran-2-yl group, a 4-methoxytetrahydropyran-4-yl group, a 1-ethoxyethyl group, a 1-butoxyethyl group, a 1-propoxyethyl group, a 3-oxocyclohexyl group, a 2-methyl-2-adamantyl group, a 2-ethyl-2-adamantyl group, a 8-methyl-8-tricyclo[5.2.1.0 2,6]decyl group, a 1,2,7,7-tetramethyl-2-norbornyl group, a 2-acetoxymenthyl group, a 2-hydroxymethyl group a 1-methyl-1-cyclohexylethyl group, a 4-methyl-2-oxotetrahydro-2H-pyran-4-yl group, a 2,3-dimethylbutan-2-yl group, a 2,3,3-trimethylbutan-2-yl group, a 1-methyl cyclopentyl group, a 1-ethyl cyclopentyl group, a 1-methyl cyclohexyl group, 1-ethyl cyclohexyl group, a 1,2,3,3-tetramethylbicyclo[2.2.1]heptan-2-yl group, a 2-ethyl-1,3,3-trimethylbicyclo[2.2.1]heptan-2-yl group, a 2,6,6-trimethylbicyclo[3.1.1]heptan-2-yl group, a 2,3-dimethylpentan-3-yl group, or a 3-ethyl-2-methylpentan-3-yl group.

In accordance with the above embodiments, with reference to (3), an exemplary molar percentage range for v may be 0-10%. A further exemplary molar percentage range for v may be 3-8%. A still further exemplary mole percentage range for v may be 4-6%. An exemplary molar percentage range for w may be 0-20%. A further exemplary molar percentage range for w may be 7-15%. A still further exemplary mole percentage range for w may be 9-12%. An exemplary molar percentage range for x may be 14-80%. A further exemplary molar percentage range for x may be 15-30%. A still further exemplary molar percentage range for x may be 16-20%. An exemplary molar percentage range for y may be 0-40%. A further exemplary molar percentage range for y may be 25-35%. A still further exemplary mole percentage range for y may be 28-33%. An exemplary molar percentage range for z may be 20-50%. A further exemplary molar percentage range for z may be 25-40%. A still further exemplary mole percentage range for z may be 29-36%. Mole percentages are not independent in that they must add to 100%.

In any aspect of this invention above in which at least one polymer comprises a structure (3), in one embodiment, A is a methylene group, an ethylene group or a 1,2-propylene group and B is a methyl group, an ethyl group, a propyl group or a butyl group.

In any aspect of this invention above in which at least one polymer comprises a structure (3), in one embodiment, A is a methylene group, an ethylene group or a 1,2-propylene group.

In any aspect of this invention above in which at least one polymer comprises a structure (3), in one embodiment, A is an ethylene group or a 1,2-propylene group.

In any aspect of this invention above in which at least one polymer comprises a structure (3), in one embodiment, A is a methylene group.

In any aspect of this invention above in which at least one polymer comprises a structure (3), in one embodiment, A is an ethylene group.

In any aspect of this invention above in which at least one polymer comprises a structure (3), in one embodiment, A may be an 1,2-propylene group.

In any aspect of this invention above in which at least one polymer comprises a structure (3), B is a methyl group, an ethyl group, a propyl group or a butyl group.

In any aspect of this invention above in which at least one polymer comprises a structure (3), in one embodiment, B is an ethyl group, a propyl group or a butyl group.

In any aspect of this invention above in which at least one polymer comprises a structure (3), in one embodiment, B is a methyl group.

In any aspect of this invention above in which at least one polymer comprises a structure (3), in one embodiment, B is an ethyl group.

In any aspect of this invention above in which at least one polymer comprises a structure (3), in one embodiment, B is a propyl group.

In any aspect of this invention above in which at least one polymer comprises a structure (3), in one embodiment, B is a butyl group.

In any aspect of this invention above in which at least one polymer comprises a structure (3), in one embodiment, A is a methylene group, an ethylene group or a 1,2-propylene group, D is a —COOCH$_2$— or —COO— group and Ar is a phenyl or hydroxyphenyl group. In another aspect of this embodiment E is a 1,2-propylene group.

In any aspect of this invention above in which at least one polymer comprises a structure (3), in one embodiment, D is a —COOCH$_2$— or —COO— group and Ar is a phenyl or hydroxyphenyl group. In another aspect of this embodiment E is a 1,2-propylene group.

In any aspect of this invention above in which at least one polymer comprises a structure (3), in one embodiment, D is a —COOCH$_2$— or —COO— group.

In any aspect of this invention above in which at least one polymer comprises a structure (3), in one embodiment, D is a —COOCH$_2$— group.

In any aspect of this invention above in which at least one polymer comprises a structure (3), in one embodiment, D is a —COO— group.

In any aspect of this invention above in which at least one polymer comprises a structure (3), Ar is a phenyl or hydroxyphenyl group.

In any aspect of this invention above in which at least one polymer comprises a structure (3), Ar is a phenyl.

In any aspect of this invention above in which at least one polymer comprises a structure (3), Ar is a or hydroxyphenyl group.

In another aspect of this invention above in which at least one polymer comprises a structure (3), G is an acid cleavable group which is cleavable through a process of acidolysis. In a further embodiment of this aspect, this group cleavable by acidosis is a tertiary alkyl ester moiety. In a further embodiment the tertiary alkyl ester moiety is tert-butyl.

In another aspect of this invention which at least one polymer comprises a structure (3), G is an acid cleavable selected from the group consisting of a t-butyl group, a tetrahydropyran-2-yl group, a tetrahydrofuran-2-yl group, a 4-methoxytetrahydropyran-4-yl group, a 1-ethoxyethyl group, a 1-butoxyethyl group, a 1-propoxyethyl group, a 3-oxocyclohexyl group, a 2-methyl-2-adamantyl group, a 2-ethyl-2-adamantyl group, a 8-methyl-8-tricyclo[5.2.1.0 2,6]decyl group, a 1,2,7,7-tetramethyl-2-norbornyl group, a 2-acetoxymenthyl group, a 2-hydroxymethyl group a 1-methyl-1-cyclohexylethyl group, a 4-methyl-2-oxotetrahydro-2H-pyran-4-yl group, a 2,3-dimethylbutan-2-yl group, a 2,3,3-trimethylbutan-2-yl group, a 1-methyl cyclopentyl group, a 1-ethyl cyclopentyl group, a 1-methyl cyclohexyl group, 1-ethyl cyclohexyl group, a 1,2,3,3-tetramethylbicyclo[2.2.1]heptan-2-yl group, a 2-ethyl-1,3,3-trimethylbicyclo[2.2.1]heptan-2-yl group, a 2,6,6-trimethylbicyclo[3.1.1]heptan-2-yl group, a 2,3-dimethylpentan-3-yl group, and a 3-ethyl-2-methylpentan-3-yl group.

In the embodiment where the novel positive working photosensitive composition comprises one or more polymers comprising one or more (meth)acrylate repeat units and further comprising one or more repeat units with at least one acid cleavable group exemplary weight average molecular weights of these polymers may, without limitation, range from 800 Daltons to 30,000 Daltons. Further exemplary weight average molecular weights of the structure may, without limitation, range from 1,500 Daltons to 20,000 Daltons. Still further exemplary weight average molecular weights of the structure may, without limitation, range from 2,500 Daltons to 20,000 Daltons.

Exemplary weight average molecular weights of the structure (3) may, without limitation, range from 800 Daltons to 30,000 Daltons. Further exemplary weight average molecular weights of the structure (3) may, without limitation, range from 1,500 Daltons to 20,000 Daltons. Still further exemplary weight average molecular weights of the structure (3) may, without limitation, range from 2,500 Daltons to 20,000 Daltons.

The formulations disclosed and claimed herein, in one embodiment, comprise both novolak polymers and (meth)acrylate polymers such as having the general formula (3). As an example and without limitation, novolak polymers may comprise from 20% to 80% w/w of the total polymer loading. As a further example and without limitation, novolak polymers may comprise from 30% to 75% w/w of the total polymer loading. As a still further example and without limitation, novolak polymers may comprise from 40% to 65% w/w of the total polymer loading. The novel positive working photosensitive composition may have total solid content in the range of 30-65 weight %, and may be used for forming coatings of 5-200 microns.

Other optional additives, which have compatibility with and can be added to any of the positive working photosensitive composition disclosed and claimed herein according to need, include heterocyclic thiol compounds, auxiliary resins, plasticizers, surface leveling agents and stabilizers to improve the properties of the resist layer, coloring agents to increase the visibility of the patterned resist layer formed by development, antihalation dyes, tetraalkylammonium salts such as tetrabutylammonium oxalate and the like.

The term "heterocyclic thiol compounds" refers to heterocyclic thiol compounds comprising a ring structure chosen from the general formulas:

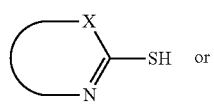

or tautomers thereof, wherein the ring structure is a single ring structure having 4-8 atoms, or a multi ring structure having 5-20 atoms, and wherein the single ring structure or the multi ring structure comprises an aromatic, non-aromatic, or heteroaromatic ring, and wherein X is coupled into the ring by a single bond and is chosen from $CR_1R_2$, O, S, Se, Te, or $NR_3$, or X is coupled into the ring by a double bond and is chosen from $CR_1$, or N, and Y is chosen from $CR_1$ or N, and wherein $R_1$, $R_2$, and $R_3$ are the same or different and represent H, a substituted or unsubstituted alkyl group having 1-8 carbon atoms, a substituted or unsubstituted alkenyl group having 1-8 carbon atoms, a substituted or unsubstituted alkynyl group having 1-8 carbon atoms, or a substituted or unsubstituted aromatic or heteroaromatic group having 1-20 carbon atoms. The term "wherein X is coupled into the ring" used above and elsewhere herein refers to a coupling counterclockwise to "X" and not a coupling to the carbon bearing the SH moiety.

It is understood that the heterocyclic thiols, 4 and 5, represent one of potentially several tautomeric forms. For example, without limitation, 4 may occur as its prototropic tautomer, whether in equilibrium or disequilibrated.

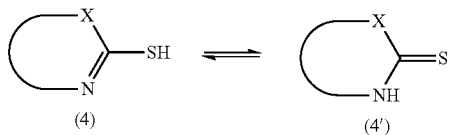

For example, without limitation, 5 may occur as its prototropic tautomer, whether in equilibrium or disequilibrated.

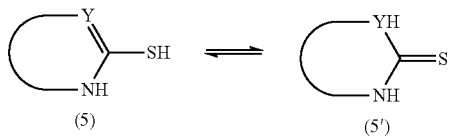

Moreover, interaction with a surface such as a chalcophilic surface or other components in solution may influence the relative concentrations of the ring structures, 3 and 4, and their respective tautomers. Accordingly, it is understood that prototropic tautomers (including annular tautomers) and valence tautomers may be referred to interchangeably by naming any of their tautomeric forms.

The heterocyclic thiols to be optionally used in positive working photosensitive composition disclosed herein may include, without limitation, substituted or unsubstituted triazole thiols, substituted or unsubstituted imidazole thiols, substituted or unsubstituted triazine thiols, substituted or unsubstituted mercapto pyrimidines, substituted or unsubstituted thiadiazole-thiols, substituted or unsubstituted indazole thiols, tautomers thereof or combinations thereof. Substituents may include, without limitation, saturated or unsaturated hydrocarbon groups, substituted or unsubstituted aromatic rings, aliphatic, aromatic or heteroaromatic alcohols, amines, amides, imides carboxylic acids, esters, ethers, halides, and the like. Such substituents may be used in concert with the heterocyclic thiol to improve solubility, to modify interaction with the substrate, to enhance exposure to light or to act as an antihalation dye.

Such heterocyclic thiols may include, without limitation the following compounds in unsubstituted or substituted form:

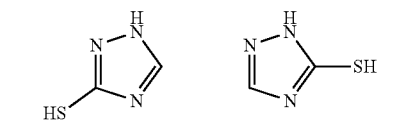

1H-1,2,4-triazole-3-thiol   1H-1,2,4-triazole-5-thiol

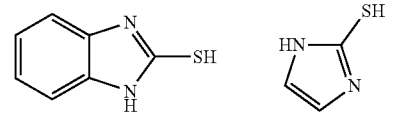

1H-benzo[d]imidazole-2-thiol   1H-imidazole-2-thiol

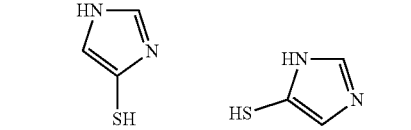

1H-imidazole-4-thiol   1H-imidazole-5-thiol

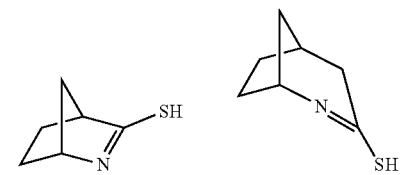

2-azabicyclo[2.2.1]hept-2-ene-3-thiol   2-azabicyclo[3.2.1]oct-2-ene-3-thiol

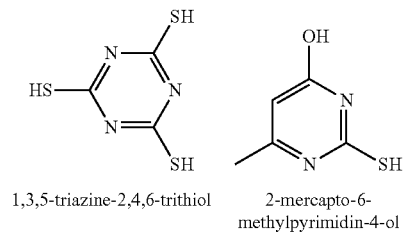

1,3,5-triazine-2,4,6-trithiol   2-mercapto-6-methylpyrimidin-4-ol

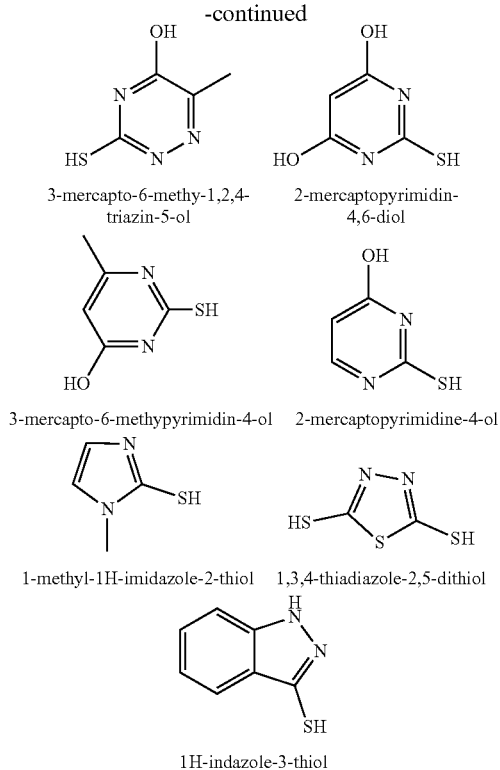

Thiouracil derivatives such as 2-thiouracil are further examples. These include, without limitation, 5-methyl-2-thiouracil, 5,6-dimethyl-2-thiouracil, 6-ethyl-5-methyl-2-thiouracil, 6-methyl-5-n-propyl-2-thiouracil, 5-ethyl-2-thioracil, 5-n-propyl-2-thiouracil, 5-n-butyl-2-thiouracil, 5-n-hexyl-2-thiouracil, 5-n-butyl-6-ethyl-2-thiouracil, 5-hydroxy-2-thiouracil, 5,6-dihydroxy-2-thiouracil, 5-hydroxy-6-n-propyl-2-thiouracil, 5-methoxy-2-thiouracil, 5-n-butoxy-2-thiouracil, 5-methoxy-6-n-propyl-2-thiouracil, 5-bromo-2-thiouracil, 5-chloro-2-thiouracil, 5-fluoro-2-thiouracil, 5-amino-2-thiouracil, 5-amino-6-methyl-2-thiouracil, 5-amino-6-phenyl-2-thiouracil, 5,6-diamino-2-thiouracil, 5-allyl-2-thiouracil, 5-allyl-3-ethyl-2-thiouracil, 5-allyl-6-phenyl-2-thiouracil, 5-benzyl-2-thiouracil, 5-benzyl-6-methyl-2-thiouracil, 5-acetamido-2-thiouracil, 6-methyl-5-nitro-2-thiouracil, 6-amino-2-thiouracil, 6-amino-5-methyl-2-thiouracil, 6-amino-5-n-propyl-2-thiouracil, 6-bromo-2-thiouracil, 6-chloro-2-thiouracil, 6-fluoro-2-thiouracil, 6-bromo-5-methyl-2-thiouracil, 6-hydroxy-2-thiouracil, 6-acetamido-2-thiouracil, 6-n-octyl-2-thiouracil, 6-dodecyl-2-thiouracil, 6-tetradodecyl-2-thiouracil, 6-hexadecyl-2-thiouracil, 6-(2-hydroxyethyl)-2-thiouracil, 6-(3-isopropyloctyl)-5-methyl-2-thiouracil, 6-(m-nitrophenyl)-2-thiouracil, 6-(m-nitrophenyl)-5-n-propyl-2-thiouracil, 6-α-naphthyl-2-thiouracil, 6-α-naphthyl-5-t-butyl-2-thiouracil, 6-(p-chlorophenyl)-2-thiouracil, 6-(p-chlorophenyl)-2-ethyl-2-thiouracil, 5-ethyl-6-eicosyl-2-thiouracil, 6-acetamido-5-ethyl-2-thiouracil, 6-eicosyl-5-allyl-2-thiouracil, 5-amino-6-phenyl-2-thiouracil, 5-amino-6-(p-chlorophenyl)-2-thiouracil, 5-methoxy-6-phenyl-2-thiouracil, 5-ethyl-6-(3,3-dimethyloctyl)-2-thiouracil, 6-(2-bromoethyl)-2-thiouracil.

In one embodiment of this novel positive working photosensitive composition, it further comprising at least one heterocyclic thiol compound, as described above. In another embodiment of this aspect of the invention the polymer it is comprised of at least one polymer which comprises a structure (3). In either of these embodiments, the heterocyclic thiol may be selected from the group consisting of an unsubstituted triazole thiol, a substituted triazole thiol, an unsubstituted imidazole thiol, a substituted imidazole thiol, substituted triazine thiol, an unsubstituted triazine thiol, a substituted mercapto pyrimidine, an unsubstituted mercapto pyrimidine, a substituted thiadiazole-thiol, an unsubstituted thiadiazole-thiol, a substituted indazole thiol, an unsubstituted indazole thiol, tautomers thereof, and combinations thereof. In a further embodiment of this aspect of the invention where the positive working photosensitive composition containing the heterocyclic thiol is selected from the group consisting of 1,3,5-triazine-2,4,6-trithiol, 2-mercapto-6-methylpyrimidin-4-ol, 3-mercapto-6-methyl-1,2,4-triazin-5-ol, 2-mercaptopyrimidine-4,6-diol, 1H-1,2,4-triazole-3-thiol, 1H-1,2,4-triazole-5-thiol, 1H-imidazole-2-thiol, 1H-imidazole-5-thiol, 1H-imidazole-4-thiol, 2-azabicyclo[3.2.1]oct-2-ene-3-thiol, 2-azabicyclo[2.2.1]hept-2-ene-3-thiol, 1H-benzo[d]imidazole-2-thiol, 2-mercapto-6-methylpyrimidin-4-ol, 2-mercaptopyrimidin-4-ol, 1-methyl-1H-imidazole-2-thiol, 1,3,4-thiadiazole-2,5-dithiol, 1H-indazole-3-thiol, tautomers thereof and combinations thereof.

In one embodiment of this novel positive working composition, it further comprises at least one heterocyclic thiol compound comprising a ring structure chosen from the general formulas:

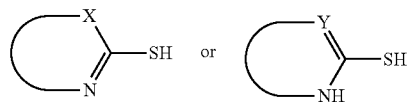

or tautomers thereof, wherein the ring structure is a single ring structure having 4-8 atoms, or a multi ring structure having 5-20 atoms, and wherein the single ring structure or the multi ring structure comprises an aromatic, non aromatic, or heteroaromatic ring, and wherein X is coupled into the ring by a single bond and is chosen from $CR_1R_2$, O, S, Se, Te, or $NR_3$, or X is coupled into the ring by a double bond and is chosen from $CR_1$, or N, and Y is chosen from $CR_1$ or N, and wherein $R_1$, $R_2$, and $R_3$ are independently selected from a group consisting of H, a substituted alkyl group having 1-8 carbon atoms, unsubstituted alkyl group having 1-8 carbon atoms, a substituted alkenyl group having 1-8 carbon atoms, unsubstituted alkenyl group having 1-8 carbon atoms, a substituted alkynyl group having 1-8 carbon atoms, unsubstituted alkynyl group having 1-8 carbon atoms, a substituted aromatic group having 1-20 carbon atoms, a substituted heteroaromatic group having 1-20 carbon atoms, unsubstituted aromatic group having 1-20 carbon atoms and unsubstituted heteroaromatic group having 1-20 carbon atoms. In another aspect of this invention the polymer it is comprised of at least one polymer which comprises a structure (3). In another aspect of this embodiment the heterocyclic thiol is selected from a group consisting of unsubstituted triazole thiol, substituted triazole thiol, unsubstituted imidazole thiol, substituted imidazole thiol, substituted triazine thiol, unsubstituted triazine thiol, a substituted mercapto pyrimidine, unsubstituted mercapto pyrimidine, a substituted thiadiazole-thiol, unsubstituted thiadiazole-thiol, substituted indazole thiol, unsubstituted indazole thiol, tautomers thereof, and combinations thereof. In another aspect of this embodiment the heterocyclic thiol is selected from a group consisting of 1,3,5-triazine-2,4,6-trithiol, 2-mercapto-6-methylpyrimidin-4-ol, 3-mercapto-6-methyl-1,2,4-triazin-5-ol, 2-mercaptopyrimidine-4,6-diol, 1H-1,2,4-triazole-3-thiol, 1H-1,2,4-triazole-5-thiol, 1H-imidazole-2-thiol, 1H-imidazole-5-thiol, 1H-imidazole-4-thiol, 2-azabicyclo[3.2.1]oct-2-ene-3-thiol, 2-azabicyclo[2.2.1]hept-2-ene-3-thiol, 1H-benzo[d]imidazole-2-thiol, 2-mercapto-6-methylpyrimidin-4-ol, 2-mercaptopyrimidin-4-ol, 1-methyl-1H-imidazole-2-thiol, 1,3,4-thiadiazole-2,5-dithiol, 1H-indazole-3-thiol, tautomers thereof and combinations thereof.

In aspects of this invention which comprise a surface leveling agents it may include surfactants. There is no particular restriction with regard to the surfactant, and the examples of it include a polyoxyethylene alkyl ether such as polyoxyethylene lauryl ether, polyoxyethylene stearyl ether, polyoxyethylene cetyl ether, and polyoxyethylene olein ether; a polyoxyethylene alkylaryl ether such as polyoxyethylene octylphenol ether and polyoxyethylene nonylphenol ether; a polyoxyethylene polyoxypropylene block copolymer; a sorbitane fatty acid ester such as sorbitane monolaurate, sorbitane monovalmitate, and sorbitane monostearate; a nonionic surfactant of a polyoxyethylene sorbitane fatty acid ester such as polyoxyethylene sorbitane monolaurate, polyoxyethylene sorbitane monopalmitate, polyoxyethylene sorbitane monostearate, polyethylene sorbitane trioleate, and polyoxyethylene sorbitane tristearate; a fluorinated surfactant such as F-Top EF301, EF303, and EF352 (manufactured by Jemco Inc.), Megafac F171, F172, F173, R08, R30, R90, and R94 (manufactured by Dainippon Ink & Chemicals, Inc.), Florad FC-430, FC-431, FC-4430, and FC-4432 (manufactured by Sumitomo 3M Ltd.), Asahi Guard AG710, Surflon S-381, S-382, S-386, SC101, SC102, SC103, SC104, SC105, SC106, Surfinol E1004, KH-10, KH-20, KH-30, and KH-40 (manufactured by Asahi Glass Co., Ltd.); an organosiloxane polymer such as KP-341, X-70-092, and X-70-093 (manufactured by Shin-Etsu Chemical Co., Ltd.); and an acrylic acid or a methacrylic acid polymer such as Polyflow No. 75 and No. 95 (manufactured by Kyoeisha Yushikagaku Kogyo K. K.)

The procedure for the preparation of a patterned photoresist layer by using the novel positive working photosensitive composition disclosed herein can be conventional. For example, a substrate such as a semiconductor silicon wafer or one with a metal coating as described previously, is evenly coated with the photosensitive composition in the form of a solution by using a suitable coating machine such as a spin-coater followed by baking in a convection oven or on a hotplate to form a photoresist layer which is then exposed pattern-wise to actinic radiation such as deep ultraviolet light, near ultraviolet light, or visible light emitted from low-pressure, high-pressure and ultra-high-pressure mercury lamps, arc lamps, xenon lamps, ArF, KrF and $F_2$ excimer lasers, electron beams, x-rays, extreme UV sources, and the like through a photomask or a from a reflective mask bearing a desired pattern on an exposure apparatus and electron beams scanned in accordance with a desired pattern to build up a latent image of the pattern in the resist layer. The actinic radiation may range from 250 nm to 436 nm. Thereafter, the latent image in the photoresist layer may optionally be baked in a convection oven or on a hotplate, developed using an alkaline developer solution such as an aqueous solution of tetra ($C_1$-$C_4$ alkyl)ammonium hydroxide, choline hydroxide, lithium hydroxide, sodium hydroxide, or potassium hydroxide, for example, tetramethyl ammonium hydroxide, in a concentration of 1 to 10% w/w, to yield a patterned photoresist layer having good fidelity to the pattern of the photomask.

Thicknesses may range from 2 microns to 100 microns. To achieve these thicknesses, a combination of different spin speeds and total solids concentrations may be employed. Depending on the size of the substrate, spin speeds of from 500 rpm to 10,000 rpm may be used. Concentration may be expressed as a percentage w/w of total solids in the positive working photosensitive composition. Without limitation, an exemplary total solids percentage w/w is from 0.05% to 65%. Without limitation, a further exemplary total solids percentage w/w is from 20% to 60%. Without limitation, a further exemplary total solids percentage w/w is from 40% to 55%.

The positive working photosensitive composition comprises one or more polymers, one or more photoacid generators, one or more solvents and one or more heterocyclic thiol additives shown supra. The photosensitive may further contain a solvent. As noted supra. Given as a percentage w/w of total solids, for example, polymers may be present at from 30% to 80% of total solids, photoacid generators may be present from 0.1% to 10% of total solids, heterocyclic thiol additives may be present from 0.01% to 5% of total solids. Alternatively, polymers may be present at from 40% to 60% of total solids, photoacid generators may be present from 0.2% to 5% of total solids, heterocyclic thiol additives may be present from 0.01% to 2% of total solids.

Further disclosed herein is a method of forming a positive relief image comprising: forming a photosensitive layer by applying the positive working photosensitive composition described herein to a substrate; image-wise exposing the photosensitive layer to actinic radiation to form a latent image; and developing the latent image in a developer. Optionally, the image-wise exposed photosensitive layer may be thermally treated, depending on the chemistry of deprotection.

In one embodiment of this method of forming a positive relief image it comprises the steps:

a) forming a photosensitive layer by applying the inventive positive working photosensitive composition to a substrate;

b) image-wise exposing the photosensitive layer to actinic radiation to form a latent image; and c) developing the latent image in a developer, and d) an optional step wherein the image-wise exposed photosensitive layer is thermally treated.

In another aspect of this inventive method, the developer comprises at least one compound selected from the group consisting of tetra ($C_1$-$C_4$ alkyl)ammonium hydroxide, choline hydroxide, lithium hydroxide, sodium hydroxide, and potassium hydroxide In another aspect of this inventive method the positive working photosensitive composition further comprises at least one heterocyclic thiol compound comprising a ring structure chosen from the general formulas:

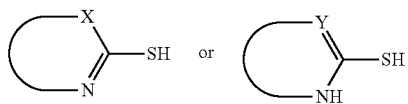

or tautomers thereof, wherein the ring structure is a single ring structure having 4-8 atoms, or a multi ring structure having 5-20 atoms, and wherein the single ring structure or the multi ring structure comprises an aromatic, non aromatic, or heteroaromatic ring, and wherein X is coupled into the ring by a single bond and is chosen from $CR_1R_2$, O, S, Se, Te, or $NR_3$, or X is coupled into the ring by a double bond and is chosen from $CR_1$, or N, and Y is chosen from $CR_1$ or N, and wherein $R_1$, $R_2$, and $R_3$ are independently selected from a group consisting of H, a substituted alkyl group having 1-8 carbon atoms, unsubstituted alkyl group having 1-8 carbon atoms, a substituted alkenyl group having 1-8 carbon atoms, unsubstituted alkenyl group having 1-8 carbon atoms, a substituted alkynyl group having 1-8 carbon atoms, unsubstituted alkynyl group having 1-8 carbon atoms, a substituted aromatic group having 1-20 carbon atoms, a substituted heteroaromatic group having 1-20 carbon atoms, unsubstituted aromatic group having 1-20 carbon atoms and unsubstituted heteroaromatic group having 1-20 carbon atoms.

In another aspect of this inventive method, in the positive working photosensitive composition, the polymer comprising one or more (meth)acrylate repeat units comprising one or more repeat units with at least one acid cleavable group has the following formula (3):

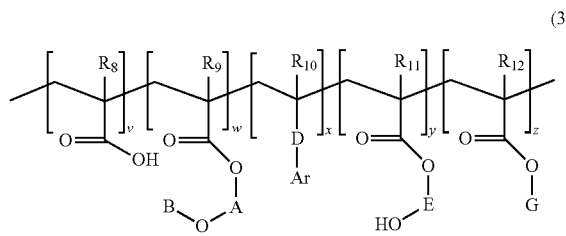

(3)

wherein $R_8$-$R_{12}$ are, independently, —H, F or —$CH_3$, A is a linear or branched $C_1$-$C_{10}$ alkylene group, B is a $C_1$-$C_{12}$ alkyl or alicyclic group, D is a linking group that may be a chemical bond, a carboxylate group, wherein the carbonyl carbon is bonded to the polymer backbone, or a —$COOCH_2$— group, wherein the carbonyl carbon is bonded to the polymer backbone, Ar is a substituted or unsubstituted aromatic group or heteroaromatic group, E is a linear or branched $C_2$-$C_{10}$ alkylene group, G is an acid cleavable group, v is 0-10 mole %, w is 0 mole %-20 mole %, x is 14 mole %-80 mole %, y is 0 mole %-40 mole % and z is 20 mole %-50 mole %. In another aspect of this inventive process, the positive working photosensitive composition, comprises at least one heterocyclic thiol compound as described in any of the embodiments described above for the photosensitive composition.

In any of the above methods of forming a positive relief image, the wavelength of the actinic radiation is from about 240 nm to about 450 nm.

Each of the documents referred to above are incorporated herein by reference in its entirety, for all purposes. The following specific examples will provide detailed illustrations of the methods of producing and utilizing positive working photosensitive composition of the present invention. These examples are not intended, however, to limit or restrict the scope of the invention in any way and should not be construed as providing conditions, parameters or values which must be utilized exclusively in order to practice the present invention.

EXAMPLES

Although the present invention has been shown and described with reference to particular examples, various changes and modifications which are obvious to persons skilled in the art to which the invention pertains are deemed to lie within the spirit, scope and contemplation of the subject matter set forth in the appended claims.

Monomers and other chemicals and solvent unless otherwise indicated were obtained from Sigma-Aldrich Corp. (St. Louis, Mo., USA).

Synthesis Examples

Synthesis Example 1

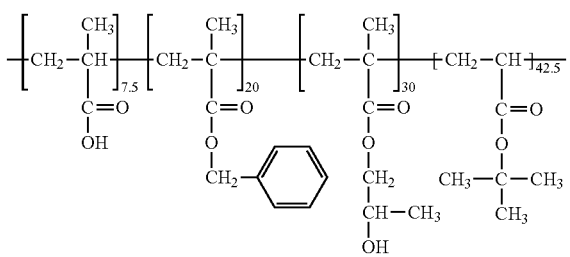

Monomer repeat unit percentages are given as mole percentages. In this example, 6.46 g of methacrylic acid, 35.24 g of benzyl methacrylate, 43.25 g of hydroxypropyl methacrylate, 54.47 g of tert-butyl acrylate were mixed in 209.1 g of PGME solvent. The polymerization reaction proceeds in the presence of 2.3 g of AIBN at 90° C., under nitrogen for 18 hours. After cooling down to room temperature, the reaction mixture was precipitated in DI water. The polymer solid was washed and dried under vacuum at 45° C., yielding 137.1 g (98% yield) with a weight average molecular weight of 15,072 Daltons.

Synthesis Example 2

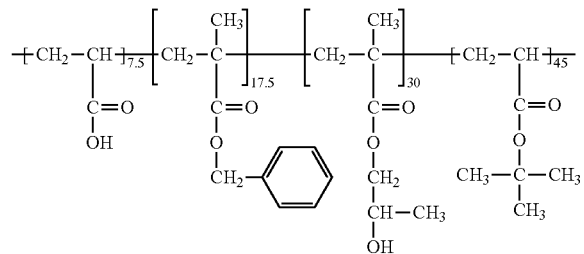

Monomer repeat unit percentages are given as mole percentages. In this example, 4.32 g of acrylic acid, 24.67 g of benzyl methacrylate, 34.60 g of hydroxypropyl methacrylate, 46.14 g of tert-butyl acrylate were mixed in 207.1 g of PGME solvent. The polymerization reaction proceeded in the presence of 1.84 g of AIBN at 90° C., under nitrogen for 18 hours. After cooling down to room temperature, the reaction mixture was precipitated in DI water. The polymer solid was washed and dried under vacuum at 45° C., yielding 107.3 g (98% yield) with a weight average molecular weight of 16,138 Daltons.

Synthesis Example 3

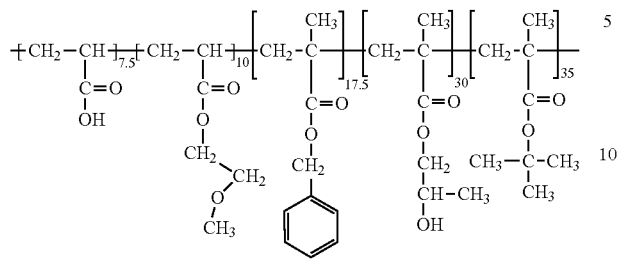

2.7 g of acrylic acid, 6.5 g of methoxyethyl acylate, 15.4 g of benzyl methacrylate, 21.6 g of hydroxypropyl methacrylate, 24.9 g of tert-butyl methacrylate were mixed in 135.2 g of PGME solvent. The polymerization reaction proceeded in the presence of 1.6 g of AIBN at 90° C., under nitrogen for 18 hours. After cooling down to room temperature, the reaction mixture was precipitated in DI water. The white polymer solid was washed and dried under vacuum at 45° C., yielding 70.3 g (99% yield) with a weight average molecular weight of 17,153 Daltons.

Synthesis Example 4

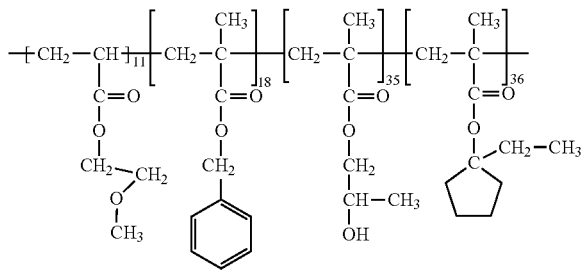

Monomer repeat unit percentages are given as mole percentages. In this example, 7.16 g of methoxyethyl acrylate, 15.86 g of benzyl methacrylate, 25.23 g of hydroxypropyl methacrylate, 32.78 g of 1-ethylcyclopentyl methacrylate (Osaka Organic Chemical Industry LTD, Osaka, Japan) were mixed in 152.6 g of PGME solvent. The polymerization reaction proceeded in the presence of 1.2 g of AIBN at 90° C., under nitrogen for 18 hours. After cooling down to room temperature, the reaction mixture was precipitated in DI water. The polymer solid was washed and dried under vacuum at 45° C., yielding 79.3 g (98% yield) with a weight average molecular weight of 17,888 Daltons.

Synthesis Example 5 (Tributylammonium oxalate (TBA oxalate))

Oxalic acid (10 g) was mixed with 50 mL of anhydrous methanol and cooled to 0° C. Tributylamine (Thermo Fisher Scientific, Waltham, Mass.) (24.7 g) also chilled to 0° C. was added to the stirred mixture of Oxalic acid over a period of ~½ hour. After the addition, the reaction mixture was allowed to return to room temperature and stirred overnight. After this time the methanol was removed under vacuum to afford a white amorphous organic salt. This solid was dispersed into 10 mL of anhydrous diethyl ether (Thermo Fisher Scientific), stirred, and this suspension filtered to recover the salt, this process was repeated. After the final filtration the product was dried to constant weight under vacuum at ~70° C. to give ~a 100% yield of white solid. The Infrared spectrum of this white solid shows two distinct carbonyl absorbance peaks at ~1730 and 1650 cm$^{-1}$.

Synthesis Example 6 (Commercial Source and Preparation of Novolak Polymer Components)

For the following formulation examples, three novolak polymers were used. Novolak-1 was synthesized from m-cresol and formaldehyde and had a bulk dissolution rate in 2.38% aqueous TMAH developer of 700 Å/sec; it was obtained from Allnex, Brussels, Belgium (SPN-560 S Resin). Novolak-2 was synthesized from m-cresol and formaldehyde and had a bulk dissolution rate in 2.38% aqueous TMAH developer of 1,600 Å/sec; it was obtained from Allnex, Brussels, Belgium (SPN-560 F Resin). Novolak-3 is a 1/1 blend of Novolak-1 and Novolak-2, with a bulk dissolution rate in 2.38% aqueous TMAH developer of 1,000 Å/sec (AZ® 300 MIF developer EMD Performance Materials Philadelphia Pa.).

The PAG component in the following resist formulations, 1,3-dioxo-1H-benzo[de]isoquinolin-2(3H)-yl trifluoromethanesulfonate, also called naphthalene dicarboximidyl triflate (NIT) was obtained from ENF Technology, Seoul, Korea.

Coating: All formulations were tested on 8" diameter Si and Cu wafers. The Si wafers were dehydration baked and vapor primed with hexamethyldisilazane (HMDS). The Cu wafers were silicon wafers coated with 5,000 Angstroms of silicon dioxide, 250 Angstroms of tantalum nitride, and 3,500 Angstroms of Cu (PVD deposited).

The photoresist coatings were prepared by spin coating the photoresist samples and applying a soft bake for 300 seconds at 130° C. on standard wafer track hot plate in contact mode. The spin speed was adjusted to obtain 80 micron thick photoresist films for the uniformity testing, and to obtain 50 micron for the lithographic imaging testing. All film thickness measurements were conducted on Si wafers using optical measurements. The coating uniformity was measured as 46 point on whole wafer with 3 mm edge exclusion on a Foothill KT-22 (Foothill Instruments, LLC, La Canada, Calif., USA).

Imaging: The wafers were exposed on SUSS MA200 CC Mask Aligner (SUSS MicroTec Inc. Corona, Calif., USA). The photoresist was post exposure baked at 100° C. for 100 seconds and puddle developed for 240 seconds in AZ 300 MIF developer (0.26N aqueous solution of tetramethyl ammoniumhydroxide=TMAH) at 23° C. The developed photoresist images were inspected using Hitachi S4700 or AMRAY 4200L electron microscopes.

Formulation Examples

Formulation Example 1

19.2 g polymer of Synthesis Example 1, 29.0 g of Novolak-3, 0.36 g of 1,3-dioxo-1H-benzo[de]isoquinolin-2 (3H)-yl trifluoromethanesulfonate [also called naphthalene dicarboximidyl triflate, NIT] (NIT PAG), 0.05 g of 6-methyl-2-thiouracil [also called 2-mercapto-6-methylpyrimidin-4-ol], 0.036 g of tetrabutyl ammonium oxalate and 0.050 g of APS-437 were dissolved in 51.3 g of PGMEA solvent to make a solution. The solution was filtered and coated on Si wafers for the coating uniformity test.

Formulation Example 2

19.2 g polymer of Synthesis Example 1, 29.0 g of Novolak-3, 0.36 g of NIT PAG, 0.05 g of 6-methyl-2-thiouracil, 0.036 g of tetrabutyl ammonium oxalate (Merck KGaA, PM-I, Wiesbaden, Germany supplier info) and 0.050 g of APS-437 were dissolved in 51.3 g of PGMEA and 3-methoxybutyl acetate in a weight ratio of about 64:36 as co-solvent to make a solution. The solution was filtered and coated on Si wafers for the coating uniformity test.

Formulation Example 3

19.2 g polymer of Synthesis Example 1, 29.0 g of Novolak-3, 0.36 g of NIT PAG, 0.05 g of 6-methyl-2-thiouracil, 0.036 g of tetrabutyl ammonium oxalate and 0.050 g of APS-437 (ShinEtsu Chemical Co. LTd, Tokyo, Japan company) were dissolved in 51.3 g of PGMEA and 2-ethoxyethyl acetate in a weight ratio of about 64:36 as co-solvent to make a solution. The solution was filtered and coated on Si wafers for the coating uniformity test.

Formulation Example 4

19.2 g polymer of Synthesis Example 1, 29.0 g of Novolak-3, 0.36 g of NIT PAG, 0.05 g of 6-methyl-2-thiouracil, 0.036 g of tetrabutyl ammonium oxalate and 0.050 g of APS-437 were dissolved in 51.3 g of PGMEA and 2-butoxyethyl acetate in a weight ratio of about 64:36 as co-solvent to make a solution. The solution was filtered and coated on Si wafers for the coating uniformity test.

Formulation Example 5

19.2 g polymer of Synthesis Example 1, 29.0 g of Novolak-3, 0.36 g of NIT PAG, 0.05 g of 6-methyl-2-thiouracil, 0.036 g of tetrabutyl ammonium oxalate and 0.050 g of APS-437 were dissolved in 51.3 g of PGMEA and propylene glycol diacetate in a weight ratio of about 64:36 as co-solvent to make a solution. The solution was filtered and coated on Si wafers for the coating uniformity test.

Formulation Example 6

19.2 g polymer of Synthesis Example 1, 29.0 g of Novolak-3, 0.36 g of NIT PAG, 0.05 g of 6-methyl-2-thiouracil, 0.036 g of tetrabutyl ammonium oxalate and 0.050 g of APS-437 were dissolved in 51.3 g of PGMEA and ethylene glycol diacetate in a weight ratio of about 64:36 as co-solvent to make a solution. The solution was filtered and coated on Si wafers for the coating uniformity test.

Formulation Example 7

19.2 g polymer of Synthesis Example 1, 29.0 g of Novolak-3, 0.36 g of NIT PAG, 0.05 g of 6-methyl-2-thiouracil, 0.036 g of tetrabutyl ammonium oxalate and 0.050 g of APS-437 were dissolved in 51.3 g of PGMEA and γ-Butyrolactone in a weight ratio of about 80:20 as co-solvent to make a solution. The solution was filtered and coated on Si wafers for the coating uniformity test.

Formulation Example 8

19.2 g polymer of Synthesis Example 1, 29.0 g of Novolak-3, 0.36 g of NIT PAG, 0.05 g of 6-methyl-2-thiouracil, 0.036 g of tetrabutyl ammonium oxalate and 0.050 g of APS-437 were dissolved in 51.3 g of PGMEA and ethyl 3-ethoxypropionate in a weight ratio of about 64:36 as co-solvent to make a solution. The solution was filtered and coated on Si wafers for the coating uniformity test.

Formulation Example 9

19.2 g polymer of Synthesis Example 1, 29.0 g of Novolak-3, 0.36 g of NIT PAG, 0.036 g of tetrabutyl ammonium oxalate and 0.050 g of APS-437 were dissolved in 51.3 g of PGMEA and 3-methoxybutyl acetate in a weight ratio of about 64:36 as co-solvent to make a solution. The solution was filtered and coated on Si wafers for the coating uniformity test.

Formulation Example 10

19.2 g polymer of Synthesis Example 1, 29.0 g of Novolak-3, 0.36 g of NIT PAG, 0.05 g of 6-methyl-2-thiouracil, 0.036 g of tetrabutyl ammonium oxalate and 0.050 g of APS-437 were dissolved in 51.3 g of PGMEA and 3-methoxybutyl acetate in a weight ratio of about 45:55 as co-solvent to make a solution. The solution was filtered and coated on Si wafers for the coating uniformity test.

The coating uniformity test, as measured on a Foothill KT-22 (Foothill Instruments, LLC, La Canada, Calif., USA), generally became much worse as the targeted film thickness increased. The edge film thickness became thicker than the center film thickness especially the film thickness over 60 microns. Therefore, the standard deviation for coating uniformity became larger with shorter edge exclusion such as 3 mm. The solvent composition had a strong effect on the coating uniformity.

Table 1, which shows the coating test was performed on SUSS coater under the same coating recipe for the film thickness 80 microns.

Formulations 2, 5, 7, and 9 which contain the inventive composition of solvent d1), d2) or d3) all give a coating uniformity with a standard deviation % of less than 10%.

Moreover, the heterocyclic thiol compound has no effect on coating uniformity. Specifically Formulation 9 which is the same as Formulation 2 except that it does not contain a Heterocyclic thiol compound gives approximately same coating uniformity under the same coating conditions both under a standard deviation % of 10%.

On the other hand Formulation 1 with PGMEA alone, Formulation 3, and 4 with a mixture of 2-ethoxyethyl acetate and PGMEA, Formulation 6 ethylene glycol diacetate and PGMEA; Formulation 8 with ethyl 3-ethoxyproprionate and PGMEA; Formulation 10 with a mixture of 3-methoxybutyl acetate and PGMEA where the 3-methoxybutyl acetate is greater than 40% all give coating uniformity greater with a standard deviation % of more than 10%.

Consequently, only the three inventive mixed solvent systems led to a good coating uniformity as follows:

d1) a solvent mixture consisting essentially of a composition of PGMEA and 3MBA which ranges from 95 wt % PGMEA and 5 wt % 3MBA to 61 wt % PGMEA and 39 wt % 3MBA;

d2) a solvent mixture consisting essentially of a composition of PGMEA and GBL which ranges from 95 wt % PGMEA and 5 wt % GBL to 20 wt % PGMEA and 80 wt % GBL; and d3) a solvent mixture consisting essentially of a composition of PGMEA and PGDA which ranges from 95 wt % PGMEA and 5 wt % PGDA to 20 wt % PGMEA and 80 wt % PGDA.

Moreover, Formulations 2 and 10 were tested lithographically and compared. These tests were done using films that were 50 micron thick prepared in the same manner, as described above for the uniformity tests, but spinning at a higher speed so as to obtain thinner films. Lithographic performance was ascertained by imaging 10 microns lines with a pitch of 10 microns and an aspect ratio of 5/1 (open 10 um line for 50 micron film thickness) at an exposure dose of 250 mJ/cm$^2$ using the imaging and development conditions described above. It was found that under these conditions no line collapse was seen for the images exposed with Formulation 2, while extensive pattern collapse was observed with Formulation 10 which contained an amount of 3MBA greater than 40 wt %. It was found, that under these conditions no line collapse was seen for the images exposed with Formulation 2, while extensive pattern collapse was observed with Formulation 10 which contained an amount of 3MBA greater than 40 wt %. Therefore, more loading (over 40 wt %) of 3-methoxybutyl acetate leads to unexpected problems related to both coating uniformity and lithographic performance requiring the applicant's novel composition to resolve.

TABLE 1

Coating Results with different solvents

| Formulation example | Co-solvent/PGMEA Ratio | Structure | Coating Uniformity* Standard Deviation % |
|---|---|---|---|
| 1 | None 0/100 | | 14.94 |
| 2 | 3-methoxybutyl acetate (3MBA) 36/64 | | 9.58 |
| 3 | 2-ethoxyethyl acetate 36/64 | | 10.86 |
| 4 | 2-butoxyethyl acetate 36/64 | | 11.77 |
| 5 | propylene glycol diacetate (PGDA) 36/64 | | 9.28 |
| 6 | ethylene glycol diacetate 36/64 | | 10.48 |
| 7 | γ-Butyrolactone (GBL) 20/80 | | 9.74 |
| 8 | ethyl 3-ethoxypropionate 36/64 | | 16.54 |
| 9 | 3-methoxybutyl acetate (3MBA) 36/64 | | 9.48 |
| 10 | 3-methoxybutyl acetate (3MBA) 55/45 | | 10.14 |

*Coating uniformity was measured at 3 mm edge exclusion.

What is claimed is:

1. A positive working photosensitive composition comprising:
   a) at least one photoacid generator;
   b) at least one novolak polymer;
   c) at least one polymer comprising one or more (meth)acrylate repeat units and further comprising one or more repeat units with at least one acid cleavable group; and
   d) a solvent mixture selected from the group consisting of:
      d1) a solvent mixture consisting essentially of a composition of PGMEA and 3MBA which ranges from 95 wt % PGMEA and 5 wt % 3MBA to 61 wt % PGMEA and 39 wt % 3MBA.

2. The positive working photosensitive composition of claim 1, wherein the at least one photoacid generator is selected from the group consisting of an onium salt, a dicarboximidyl sulfonate ester, an oxime sulfonate ester, a diazo(sulfonyl methyl) compound, a disulfonyl methylene hydrazine compound, a nitrobenzyl sulfonate ester, a biimidazole compound, a diazomethane derivative, a glyoxime derivative, a β-ketosulfone derivative, a disulfone derivative, a sulfonic acid ester derivative, an imidoyl sulfonate derivative, and a halogenated triazine compound.

3. The positive working photosensitive composition of claim 1, wherein the at least one novolak polymer comprises one or more cresylic repeat units selected from the group consisting of o-cresol, p-cresol and m-cresol, wherein preferably the at least one novolak polymer is a cresylic novolak comprising at least 80 mole percent m-cresol.

4. The positive working photosensitive composition of claim 1, wherein the at least one polymer comprising one or more (meth)acrylate repeat units and further comprising one or more repeat units with at least one acid cleavable group comprises a structure of the following formula:

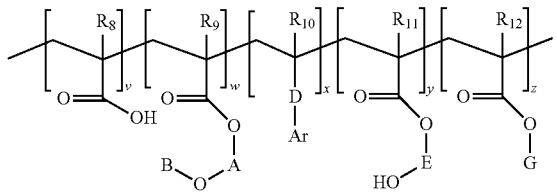

wherein $R_8$-$R_{12}$ are, independently, —H, F or —CH$_3$, A is a linear or branched $C_1$-$C_{10}$ alkylene group, B is a $C_1$-$C_{12}$ alkyl or alicyclic group, D is a linking group that may be a chemical bond, a carboxylate group wherein the carbonyl carbon is bonded to the polymer backbone, or a —COOCH$_2$— group wherein the carbonyl carbon is bonded to the polymer backbone, Ar is a substituted or unsubstituted aromatic group or heteroaromatic group, E is a linear or branched $C_2$-$C_{10}$ alkylene group, G is an acid cleavable group, v is 0 mole % 10 mole %, w is 0 mole %-20 mole %, x is 14 mole %-80 mole %, y is 0 mole %-40 mole % and z is 20 mole %-50 mole %, provided that v+w+x+y+z=100%.

5. The positive working photosensitive composition of claim 4, wherein A is a methylene group, an ethylene group or a 1,2-propylene group and B is a methyl group, an ethyl group, a propyl group or a butyl group.

6. The positive working photosensitive composition of claim 4, wherein G is an acid cleavable group which is cleaveable through a process of acidolysis, wherein G preferably is an acid cleavable group selected from the group consisting of a t-butyl group, a tetrahydropyran-2-yl group, a tetrahydrofuran-2-yl group, a 4-methoxytetrahydropyran-4-yl group, a 1-ethoxyethyl group, a 1-butoxyethyl group, a 1-propoxyethyl group, a 3-oxocyclohexyl group, a 2-methyl-2-adamantyl group, a 2-ethyl-2-adamantyl group, a 8-methyl-8-tricyclo[5.2.1.0 2,6]decyl group, a 1,2,7,7-tetramethyl-2-norbornyl group, a 2-acetoxymenthyl group, a 2-hydroxymethyl group a 1-methyl-1-cyclohexylethyl group, a 4-methyl-2-oxotetrahydro-2H-pyran-4-yl group, a 2,3-dimethylbutan-2-yl group, a 2,3,3-trimethylbutan-2-yl group, a 1-methyl cyclopentyl group, a 1-ethyl cyclopentyl group, a 1-methyl cyclohexyl group, 1-ethyl cyclohexyl group, a 1,2,3,3-tetramethylbicyclo[2.2.1]heptan-2-yl group, a 2-ethyl-1,3,3-trimethylbicyclo[2.2.1]heptan-2-yl group, a 2,6,6-trimethylbicyclo[3.1.1]heptan-2-yl group, a 2,3-dimethylpentan-3-yl group, and a 3-ethyl-2-methylpentan-3-yl group.

7. The positive working photosensitive composition of claim 4, wherein A is a methylene group, an ethylene group or a 1,2-propylene group, D is a —COOCH$_2$— or —COO— group and Ar is a phenyl or hydroxyphenyl group, and/or wherein E is a 1,2-propylene group.

8. The positive working photosensitive composition of claim 1, further comprising at least one heterocyclic thiol compound comprising a ring structure chosen from the general formulas:

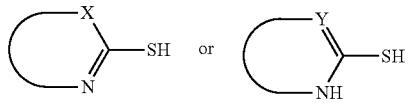

or tautomers thereof, wherein the ring structure is a single ring structure having 4-8 atoms, or a multi ring structure having 5-20 atoms, and wherein the single ring structure or the multi ring structure comprises an aromatic, non-aromatic, or heteroaromatic ring, and wherein X is coupled into the ring by a single bond and is selected from the group consisting of CR$_1$R$_2$, O, S, Se, Te, and NR$_3$, or X is coupled into the ring by a double bond and is selected from the group consisting of CR$_1$, and N, and Y is selected from the group consisting of CR$_1$ and N, and wherein R$_1$, R$_2$, and R$_3$ are independently selected from the group consisting of H, a substituted alkyl group having 1-8 carbon atoms, an unsubstituted alkyl group having 1-8 carbon atoms, a substituted alkenyl group having 1-8 carbon atoms, an unsubstituted alkenyl group having 1-8 carbon atoms, a substituted alkynyl group having 1-8 carbon atoms, an unsubstituted alkynyl group having 1-8 carbon atoms, a substituted aromatic group having 1-20 carbon atoms, a substituted heteroaromatic group having 1-20 carbon atoms, an unsubstituted aromatic group having 1-20 carbon atoms and an unsubstituted heteroaromatic group having 1-20 carbon atoms.

9. The positive working photosensitive composition of claim 8 wherein the heterocyclic thiol is selected from the group consisting of an unsubstituted triazole thiol, a substituted triazole thiol, an unsubstituted imidazole thiol, a substituted imidazole thiol, substituted triazine thiol, an unsubstituted triazine thiol, a substituted mercapto pyrimidine, an unsubstituted mercapto pyrimidine, a substituted thiadiazole-thiol, an unsubstituted thiadiazole-thiol, a substituted indazole thiol, an unsubstituted indazole thiol, tautomers thereof, and combinations thereof, wherein the heterocyclic thiol is preferably selected from the group consisting of 1,3,5-triazine-2,4,6-trithiol, 2-mercapto-6- methylpyrimidin-4-ol, 3-mercapto-6-methyl-1,2,4-triazin-5-ol, 2-mercaptopyrimidine-4,6-diol, 1H-1,2,4-triazole-3-thiol, 1H-1,2,4-triazole-5-thiol, 1H-imidazole-2-thiol, 1H-imidazole-5-thiol, 1H-imidazole-4-thiol, 2-azabicyclo[3 0.2.1]oct-2-ene-3-thiol, 2-azabicyclo[2.2.1]hept-2-ene-3-thiol, 1H-benzo[d]imidazole-2-thiol, 2-mercapto-6-methylpyrimidin-4-ol, 2-mercaptopyrimidin-4-ol, 1-methyl-1H-imidazole-2-thiol, 1,3,4-thiadiazole-2,5-dithiol, 1H-indazole-3-thiol, tautomers thereof and combinations thereof.

10. The positive working photosensitive composition of claim 4, which further comprises at least one heterocyclic thiol compound comprising a ring structure chosen from the general formulas:

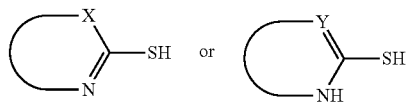

or tautomers thereof, wherein the ring structure is a single ring structure having 4-8 atoms, or a multi ring structure having 5-20 atoms, and wherein the single ring structure or the multi ring structure comprises an aromatic, non-aromatic, or heteroaromatic ring, and wherein X is coupled into the ring by a single bond and is chosen from $CR_1R_2$, O, S, Se, Te, or $NR_3$, or X is coupled into the ring by a double bond and is chosen from $CR_1$, or N, and Y is chosen from $CR_1$ or N, and wherein $R_1$, $R_2$, and $R_3$ are independently selected from a group consisting of H, a substituted alkyl group having 1-8 carbon atoms, unsubstituted alkyl group having 1-8 carbon atoms, a substituted alkenyl group having 1-8 carbon atoms, unsubstituted alkenyl group having 1-8 carbon atoms, a substituted alkynyl group having 1-8 carbon atoms, unsubstituted alkynyl group having 1-8 carbon atoms, a substituted aromatic group having 1-20 carbon atoms, a substituted heteroaromatic group having 1-20 carbon atoms, unsubstituted aromatic group having 1-20 carbon atoms and unsubstituted heteroaromatic group having 1-20 carbon atoms.

11. The positive working photosensitive composition of claim 10, wherein the heterocyclic thiol is selected from a group consisting of unsubstituted triazole thiol, substituted triazole thiol, unsubstituted imidazole thiol, substituted imidazole thiol, substituted triazine thiol, unsubstituted triazine thiol, a substituted mercapto pyrimidine, unsubstituted mercapto pyrimidine, a substituted thiadiazole-thiol, unsubstituted thiadiazole-thiol, substituted indazole thiol, unsubstituted indazole thiol, tautomers thereof, and combinations thereof, wherein the heterocyclic thiol is preferably selected from a group consisting of 1,3,5-triazine-2,4,6-trithiol, 2-mercapto-6-methylpyrimidin-4-ol, 3-mercapto-6-methyl-1,2,4-triazin-5-ol, 2-mercaptopyrimidine-4,6-diol, 1H-1,2, 4-triazole-3-thiol, 1H-1,2,4-triazole-5-thiol, 1H-imidazole-2-thiol, 1H-imidazole-5-thiol, 1H-imidazole-4-thiol, 2-azabicyclo[3.2.1]oct-2-ene-3-thiol, 2-azabicyclo[2.2.1]hept-2-ene-3-thiol, 1H-benzo[d]imidazole-2-thiol, 2-mercapto-6-methylpyrimidin-4-ol, 2-mercaptopyrimidin-4-ol, 1-methyl-1H-imidazole-2-thiol, 1,3,4-thiadiazole-2,5-dithiol, 1H-indazole-3-thiol, tautomers thereof and combinations thereof.

12. A method of forming a positive relief image comprising:

a) forming a photosensitive layer by applying the positive working photosensitive composition of claim 1 to a substrate;
b) image-wise exposing the photosensitive layer to actinic radiation to form a latent image, wherein the wavelength of the actinic radiation is from about 240 nm to about 450 nm; and
c) developing the latent image in a developer.

13. The method of forming a positive relief image of claim 12 comprising an additional step d):
d) thermally treating the image-wise exposed photosensitive layer.

14. The method of claim 12, wherein the developer comprises at least one compound selected from the group consisting of tetra ($C_1$-$C_4$ alkyl)ammonium hydroxide, choline hydroxide, lithium hydroxide, sodium hydroxide, and potassium hydroxide.

15. The method of claim 12, wherein the positive working photosensitive composition containing the polymer comprising one or more (meth)acrylate repeat units comprising one or more repeat units with at least one acid cleavable group has the following formula:

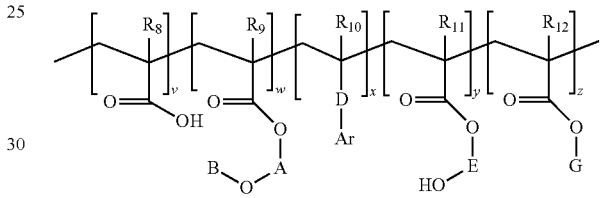

wherein $R_8$-$R_{12}$ are, independently, —H, F or —$CH_3$, A is a linear or branched $C_1$-$C_{10}$ alkylene group, B is a $C_1$-$C_{12}$ alkyl or alicyclic group, D is a linking group that may be a chemical bond, a carboxylate group, wherein the carbonyl carbon is bonded to the polymer backbone, or a —$COOCH_2$— group, wherein the carbonyl carbon is bonded to the polymer backbone, Ar is a substituted or unsubstituted aromatic group or heteroaromatic group, E is a linear or branched $C_2$-$C_{10}$ alkylene group, G is an acid cleavable group, v is 0-10 mole %, w is 0 mole %-20 mole %, x is 14 mole %-80 mole %, y is 0 mole %-40 mole % and z is 20 mole %-50 mole %.

16. The composition of claim 4, wherein D is a —$COOCH_2$— group.

17. The composition of claim 4, wherein D is a —$COOCH_2$— group, v is 0 mole %, w is present up to 20 mole %, x is 14 mole %-80 mole %, y is present up to 40 mole % and z is 20 mole %-50 mole %.

18. The composition of claim 4, wherein D is a —$COOCH_2$— group, v is present up to 10 mole %, w is 0 mole %, x is 14 mole %-80 mole %, y is present up to 40 mole % and z is 20 mole %-50 mole %.

19. The composition of claim 4, wherein D is a —$COOCH_2$— group, v is present up to 10 mole %, w is present up 20 mole %, x is 14 mole %-80 mole %, y is present up to 40 mole % and z is 20 mole %-50 mole %.

20. The composition of claim 4, wherein D is a —$COOCH_2$— group, v is 0 mole %, w is 11 mole %-20 mole %, x is 14 mole %-80 mole %, y is 35 mole % 40 mole % and z is 20 mole %-50 mole %.

21. The composition of claim 4, wherein D is a —$COOCH_2$— group, v is 7.5 mole %-10 mole %, w is 0 mole %, x is 14 mole %-80 mole %, y is present up to 40 mole % and z is 20 mole %-50 mole %.

22. The composition of claim 4, wherein D is a —COOCH$_2$— group, v is 7.5 mole %-10 mole %, w is 10 mole %-20 mole %, x is 14 mole %-80 mole %, y is 35 mole %-40 mole % and z is 20 mole %-50 mole %.

23. A positive working photosensitive composition comprising:
   a) at least one photoacid generator;
   b) at least one novolak polymer;
   c) at least one polymer comprising one or more (meth)acrylate repeat units and further comprising one or more repeat units with at least one acid cleavable group; and
   d) a solvent mixture selected from the group consisting of:
      d1) a solvent mixture consisting essentially of a composition of PGMEA and 3MBA which ranges from 95 wt % PGMEA and 5 wt % 3MBA to 61 wt % PGMEA and 39 wt % 3MBA
      d2) a solvent mixture consisting essentially of a composition of PGMEA and GBL which ranges from 95 wt % PGMEA and 5 wt % GBL to 20 wt % PGMEA and 80 wt % GBL; and
      d3) a solvent mixture consisting essentially of a composition of PGMEA and PGDA which ranges from 95 wt % PGMEA and 5 wt % PGDA to 20 wt % PGMEA and 80 wt % PGDA,
wherein the positive working photosensitive composition containing the polymer comprising one or more (meth)acrylate repeat units comprising one or more repeat units with at least one acid cleavable group has the following formula:

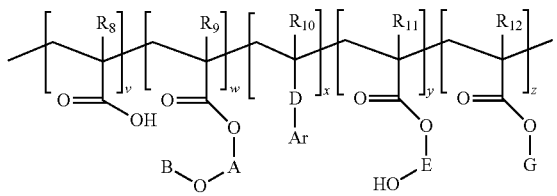

wherein R$_8$-R$_{12}$ are, independently, —H, F or —CH$_3$, A is a linear or branched C$_1$-C$_{10}$ alkylene group, B is a C$_1$-C$_{12}$ alkyl or alicyclic group, D is a —COOCH$_2$— linking group, wherein the carbonyl carbon is bonded to the polymer backbone, Ar is a substituted or unsubstituted aromatic group or heteroaromatic group, E is a linear or branched C$_2$-C$_{10}$ alkylene group, G is an acid cleavable group, v is 0-10 mole %, w is 0 mole %-20 mole %, x is 14 mole %-80 mole %, y is 0 mole %-40 mole % and z is 20 mole %-50 mole %, provided that v+w+x+y+z=100%.

24. The composition of claim 23, wherein D is a —COOCH$_2$— group, v is 0 mole %, w is present up to 20 mole %, x is 14 mole %-80 mole %, y is present up to 40 mole % and z is 20 mole %-50 mole %.

25. The composition of claim 23, wherein D is a —COOCH$_2$— group, v is present up to 10 mole %, w is 0 mole %, x is 14 mole %-80 mole %, y is present up to 40 mole % and z is 20 mole %-50 mole %.

26. The composition of claim 23, wherein D is a —COOCH$_2$— group, v is present up to 10 mole %, w is present up 20 mole %, x is 14 mole %-80 mole %, y is present up to 40 mole % and z is 20 mole %-50 mole %.

27. The composition of claim 23, wherein D is a —COOCH$_2$— group, v is 0 mole %, w is 11 mole %-20 mole %, x is 14 mole %-80 mole %, y is 35 mole % 40 mole % and z is 20 mole %-50 mole %.

28. The composition of claim 23, wherein D is a —COOCH$_2$— group, v is 7.5 mole %-10 mole %, w is 0 mole %, x is 14 mole %-80 mole %, y is present up to 40 mole % and z is 20 mole %-50 mole %.

29. The composition of claim 23, wherein D is a —COOCH$_2$— group, v is 7.5 mole %-10 mole %, w is 10 mole %-20 mole %, x is 14 mole %-80 mole %, y is 35 mole %-40 mole % and z is 20 mole %-50 mole %.

30. The positive working photosensitive composition of claim 23, wherein A is a methylene group, an ethylene group or a 1,2-propylene group and B is a methyl group, an ethyl group, a propyl group or a butyl group.

31. The positive working photosensitive composition of claim 23, wherein the at least one photoacid generator is selected from the group consisting of an onium salt, a dicarboximidyl sulfonate ester, an oxime sulfonate ester, a diazo(sulfonyl methyl) compound, a disulfonyl methylene hydrazine compound, a nitrobenzyl sulfonate ester, a biimidazole compound, a diazomethane derivative, a glyoxime derivative, a β-ketosulfone derivative, a disulfone derivative, a sulfonic acid ester derivative, an imidoyl sulfonate derivative, and a halogenated triazine compound.

32. The positive working photosensitive composition of claim 23, wherein the at least one novolak polymer comprises one or more cresylic repeat units selected from the group consisting of o-cresol, p-cresol and m-cresol, wherein preferably the at least one novolak polymer is a cresylic novolak comprising at least 80 mole percent m-cresol.

33. The positive working photosensitive composition of claim 23, wherein G is an acid cleavable group which is cleaveable through a process of acidolysis,
wherein G preferably is an acid cleavable group selected from the group consisting of a t-butyl group, a tetrahydropyran-2-yl group, a tetrahydrofuran-2-yl group, a 4-methoxytetrahydropyran-4-yl group, a 1-ethoxyethyl group, a 1-butoxyethyl group, a 1-propoxyethyl group, a 3-oxocyclohexyl group, a 2-methyl-2-adamantyl group, a 2-ethyl-2-adamantyl group, a 8-methyl-8-tricyclo[5.2.1.0 2,6]decyl group, a 1,2,7,7-tetramethyl-2-norbornyl group, a 2-acetoxymenthyl group, a 2-hydroxymethyl group a 1-methyl-1-cyclohexylethyl group, a 4-methyl-2-oxotetrahydro-2H-pyran-4-yl group, a 2,3-dimethylbutan-2-yl group, a 2,3,3-trimethylbutan-2-yl group, a 1-methyl cyclopentyl group, a 1-ethyl cyclopentyl group, a 1-methyl cyclohexyl group, 1-ethyl cyclohexyl group, a 1,2,3,3-tetramethylbicyclo[2.2.1]heptan-2-yl group, a 2-ethyl-1,3,3-trimethylbicyclo[2.2.1]heptan-2-yl group, a 2,6,6-trimethylbicyclo[3.1.1]heptan-2-yl group, a 2,3-dimethylpentan-3-yl group, and a 3-ethyl-2-methylpentan-3-yl group.

34. The positive working photosensitive composition of claim 23, further comprising at least one heterocyclic thiol compound comprising a ring structure chosen from the general formulas:

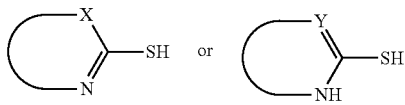

or tautomers thereof, wherein the ring structure is a single ring structure having 4-8 atoms, or a multi ring structure having 5-20 atoms, and wherein the single ring structure or the multi ring structure comprises an aromatic, non-aromatic, or heteroaromatic ring, and wherein X is coupled into the ring by a single bond and is selected from the group consisting of $CR_1R_2$, O, S, Se, Te, and $NR_3$, or X is coupled into the ring by a double bond and is selected from the group consisting of $CR_1$, and N, and Y is selected from the group consisting of $CR_1$ and N, and wherein $R_1$, $R_2$, and $R_3$ are independently selected from the group consisting of H, a substituted alkyl group having 1-8 carbon atoms, an unsubstituted alkyl group having 1-8 carbon atoms, a substituted alkenyl group having 1-8 carbon atoms, an unsubstituted alkenyl group having 1-8 carbon atoms, a substituted alkynyl group having 1-8 carbon atoms, an unsubstituted alkynyl group having 1-8 carbon atoms, a substituted aromatic group having 1-20 carbon atoms, a substituted heteroaromatic group having 1-20 carbon atoms, an unsubstituted aromatic group having 1-20 carbon atoms and an unsubstituted heteroaromatic group having 1-20 carbon atoms.

35. The positive working photosensitive composition of claim 23, wherein the heterocyclic thiol is selected from a group consisting of unsubstituted triazole thiol, substituted triazole thiol, unsubstituted imidazole thiol, substituted imidazole thiol, substituted triazine thiol, unsubstituted triazine thiol, a substituted mercapto pyrimidine, unsubstituted mercapto pyrimidine, a substituted thiadiazole-thiol, unsubstituted thiadiazole-thiol, substituted indazole thiol, unsubstituted indazole thiol, tautomers thereof, and combinations thereof, wherein the heterocyclic thiol is preferably selected from a group consisting of 1,3,5-triazine-2,4,6-trithiol, 2-mercapto-6-methylpyrimidin-4-ol, 3-mercapto-6-methyl-1,2,4-triazin-5-ol, 2-mercaptopyrimidine-4,6-diol, 1H-1,2,4-triazole-3-thiol, 1H-1,2,4-triazole-5-thiol, 1H-imidazole-2-thiol, 1H-imidazole-5-thiol, 1H-imidazole-4-thiol, 2-azabicyclo[3.2.1]oct-2-ene-3-thiol, 2-azabicyclo[2.2.1]hept-2-ene-3-thiol, 1H-benzo[d]imidazole-2-thiol, 2-mercapto-6-methylpyrimidin-4-ol, 2-mercaptopyrimidin-4-ol, 1-methyl-1H-imidazole-2-thiol, 1,3,4-thiadiazole-2,5-dithiol, 1H-indazole-3-thiol, tautomers thereof and combinations thereof.

36. A method of forming a positive relief image comprising:
  a) forming a photosensitive layer by applying the positive working photosensitive composition of claim 23 to a substrate;
  b) image-wise exposing the photosensitive layer to actinic radiation to form a latent image, wherein the wavelength of the actinic radiation is from about 240 nm to about 450 nm; and
  c) developing the latent image in a developer.

37. The method of forming a positive relief image of claim 35 comprising an additional step d):
  d) thermally treating the image-wise exposed photosensitive layer.

38. The method of claim 35, wherein the developer comprises at least one compound selected from the group consisting of tetra ($C_1$-$C_4$ alkyl)ammonium hydroxide, choline hydroxide, lithium hydroxide, sodium hydroxide, and potassium hydroxide.

* * * * *